US011080135B2

(12) United States Patent
Chen et al.

(10) Patent No.: US 11,080,135 B2
(45) Date of Patent: Aug. 3, 2021

(54) METHODS AND APPARATUS TO PERFORM ERROR DETECTION AND/OR CORRECTION IN A MEMORY DEVICE

(71) Applicant: Intel Corporation, Santa Clara, CA (US)

(72) Inventors: Yingwen Chen, Shanghai (CN); Anil Agrawal, Cupertino, CA (US); Fang Yuan, Shanghai (CN); Qing Huang, Shanghai (CN)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/617,411

(22) PCT Filed: Jun. 27, 2017

(86) PCT No.: PCT/CN2017/090259
§ 371 (c)(1),
(2) Date: Nov. 26, 2019

(87) PCT Pub. No.: WO2019/000206
PCT Pub. Date: Jan. 3, 2019

(65) Prior Publication Data
US 2020/0151056 A1 May 14, 2020

(51) Int. Cl.
*G06F 11/10* (2006.01)
*G01R 31/317* (2006.01)
(52) U.S. Cl.
CPC .... *G06F 11/1068* (2013.01); *G01R 31/31713* (2013.01)
(58) Field of Classification Search
CPC .................................................. G06F 11/1068
(Continued)

(56) References Cited

U.S. PATENT DOCUMENTS

2003/0135794 A1   7/2003  Longwell et al.
2012/0297273 A1*  11/2012  Sakaue .............. H03M 13/1188
                                              714/773

(Continued)

FOREIGN PATENT DOCUMENTS

CN   105843699 A   8/2016
JP   2008-137764 A   6/2008

OTHER PUBLICATIONS

International Searching Authority, "International Search Report," issued in connection with PCT patent application No. PCT/CN2017/090259 dated Apr. 3, 2018, 3 pages.

(Continued)

*Primary Examiner* — Fritz Alphonse
(74) *Attorney, Agent, or Firm* — Hanley, Flight & Zimmerman, LLC

(57) ABSTRACT

An example apparatus to monitor memory includes an error manager to compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations, and update a first one of the counters corresponding to the first memory location when a first address of the first memory location matches a second address of one of the memory locations in the error history log. The example apparatus further includes a command generator to transmit a command to an error corrector to perform error correction on the first memory location when the first one of the counters satisfies a threshold.

25 Claims, 12 Drawing Sheets

(58) Field of Classification Search
USPC .................................. 714/764, 766, 770, 763
See application file for complete search history.

(56) References Cited

U.S. PATENT DOCUMENTS

| | | |
|---|---|---|
| 2015/0205651 A1 | 7/2015 | Gregg et al. |
| 2016/0224412 A1 | 8/2016 | Healy et al. |
| 2016/0232063 A1 | 8/2016 | Das et al. |
| 2017/0123899 A1* | 5/2017 | Zhao ....................... H03M 7/00 |
| 2020/0081770 A1* | 3/2020 | Kumano ............. G06F 11/1068 |

OTHER PUBLICATIONS

International Searching Authority, "Written Opinion," issued in connection with PCT patent application No. PCT/CN2017/090259 dated Apr. 3, 2018, 4 pages.

\* cited by examiner

METHODS AND APPARATUS TO PERFORM ERROR DETECTION AND/OR CORRECTION IN A MEMORY DEVICE

RELATED APPLICATION

This patent arises from a national stage application of PCT Application Number PCT/CN2017/090259, which was filed on Jun. 27, 2017. PCT Application Number PCT/CN2017/090259 is hereby incorporated herein by reference in its entirety. Priority to PCT Application Number PCT/CN2017/090259 is hereby claimed.

FIELD OF THE DISCLOSURE

This disclosure relates generally to memory devices and, more particularly, to methods and apparatus to perform error detection and/or correction in a memory device.

BACKGROUND

Volatile memory devices can persist data while powered. However, when power is interrupted or removed, stored data is either lost immediately or very rapidly. Volatile memory devices such as random access memory (RAM) include memory cells that store data in binary form. A RAM memory cell is implemented using a capacitor and a transistor. The capacitor stores a charge indicative of stored data, and the transistor can be selectively activated to access (e.g., read (measure) or write (program)) the capacitor. For example, information can be written to the memory cell by charging its corresponding capacitor to store a high value or by discharging the capacitor to store a low value. After charging a capacitor to store a high value, the capacitor slowly loses charge over time. As such, the capacitor must be refreshed periodically to preserve the high value.

Due to semiconductor material defects, manufacturing defects, or wear over time, memory cells can sometimes generate errors in stored data. For example, such a capacitor and/or a transistor of a memory cell may fail over time preventing the memory cell from representing correct data. Error-detection and memory-monitoring techniques can be employed to increase the likelihood that subsequent read and/or write processes of the volatile memory devices are completed accurately and effectively.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
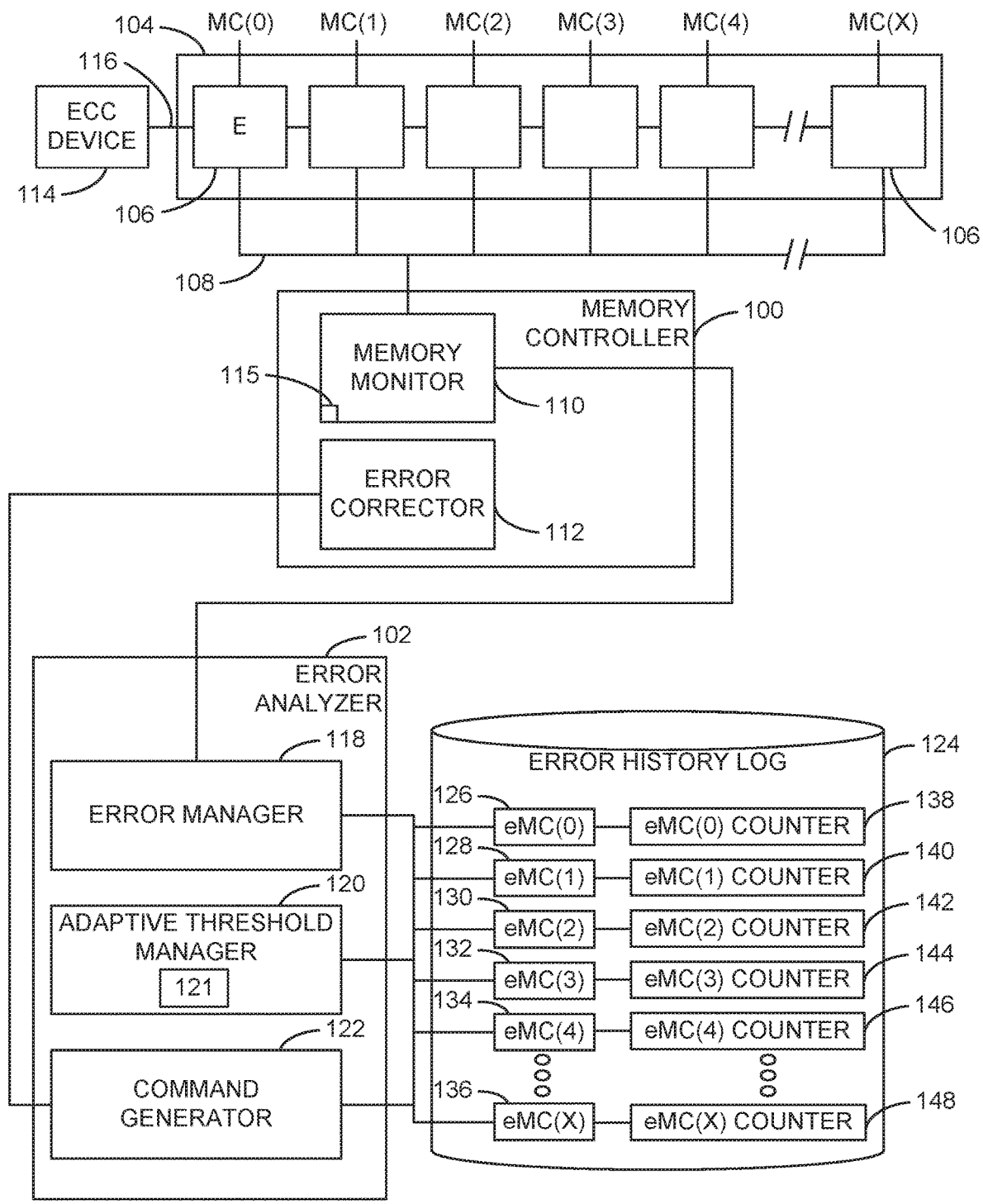
FIG. 1 illustrates an example memory controller and an example error analyzer that can be implemented in accordance with the teachings of this disclosure to perform memory error detection and/or correction of a memory device.

Examples disclosed herein may be used to perform memory error detection and/or correction in memory devices. Examples disclosed herein are described in connection with volatile memory devices such as RAM (e.g., dynamic random access memory (DRAM), synchronous DRAM (SDRAM), double data rate (DDR) SDRAM, static random access memory (SRAM), etc.). However, examples disclosed herein may alternatively or additionally be used in connection with non-volatile memory devices (e.g., flash memory, 3D flash memory, ferroelectric transistor random access memory (FeTRAM or FeRAM), phase change random access memory (PRAM), spin transfer torque (STT) memory, non-volatile RAM (NVRAM), resistive random access memory (ReRAM), etc.).

Examples disclosed herein may be used to perform memory error detection and/or correction in volatile memory devices such as Dual In-line Memory Module (DIMM) devices by using Double Device Data Correction (DDDC) or Adaptive Double Device Data Correction (ADDDC) processes that implement lockstep data distribution (e.g., lockstep configurations, partnerships, error handling, etc.). As used herein, the term "lockstep" refers to distributing error correction data over multiple memory resources to compensate for a hard failure in one memory resource that prevents deterministic data access to the failed memory resource. A memory controller that utilizes lockstep may form one or more lockstep partnerships. A lockstep partnership refers to two portions of memory over which error checking and correction is distributed or shared.

In prior ADDDC implementations, a memory controller is responsible for detecting errors in a memory module. In response to detecting an error, the memory controller stores a memory location of the error, determines a memory rank of the memory module corresponding to the memory location, and increments an error counter corresponding to the rank. In some examples, the memory controller triggers a memory correction action based on the error counter satisfying an error threshold (e.g., the error counter is greater than 5 total errors, 10 total errors, etc.). For example, the memory controller may trigger a System Management Interrupt (SMI) or enable an error status pin (e.g., adjust a voltage level of an ERROR_N[0] pin from a first voltage to a second voltage, etc.) on the memory controller. In response to the memory controller triggering the SMI or enabling the error status pin, a Basic Input/Output System (BIOS) Reliability, Availability, and Serviceability (RAS) handler or a System Service Processor (SSP) may assume control of available hardware resources to perform an ADDDC process (e.g., an AVL process) on the memory location. For example, the SSP may map data in the memory location to a spare region (e.g., a spare memory location in an ECC device).

An alternative prior ADDDC technique involves a memory controller using a System Management Module (SMM) or software running in System Management Mode to correct detected errors. The SMM or the SMM software runs in a System Management Mode of a CPU in which all normal execution, including the operating system, is suspended. When all normal execution is suspended, the SMM or the SMM software can execute with high privileges in the System Management Mode to complete tasks such as correcting memory errors.

However, using either an SSP or an SMM to detect memory errors can lead to correcting data to memory locations in which correction is unnecessary. That is, in prior techniques the memory controller takes a memory correction action based on a last error event only and, thus, may map out a region that does not include a persistent error (e.g., an error due to a manufacturing defect, a damaged component, etc.). For example, such prior techniques may define an error threshold of 10 total errors (e.g., in one or more memory locations) that are to be detected within a memory rank of a DIMM to trigger a memory correction. During operation, the memory controller increments an error counter after each detected error. In some examples, the memory controller may detect nine errors that are a result of a persistent error in a first memory cell at a first memory location of a rank. The memory controller may detect a $10^{th}$ error that is a result of a random error in a second memory cell at a second memory location of the same rank. When the error counter increments to 10, the error threshold is satisfied. The memory controller then performs an ADDDC action on the second memory cell that caused the $10^{th}$ error (e.g., the random error) without addressing the first memory cell that caused the first nine errors (e.g., the persistent error).

Other prior techniques may define an error threshold of one total error that is to be detected within a memory rank of a DIMM to trigger a memory correction. As a result, each error that is detected satisfies the error threshold (e.g., the one-error threshold), triggering a memory correction action. For example, in response to detecting an error, a memory controller saves a memory location of the error in an error history log. The memory controller may compare the error memory location to a plurality of memory locations in the error history log, where the memory locations were previously identified as error memory locations. In response to the error memory location matching one of the memory locations in the error history log, the memory controller may identify the error as a persistent error and trigger a memory correction action. For example, the memory controller may trigger an SMI to enable the SMM to perform an ADDDC action. However, system performance can decrease significantly by reducing the error threshold to one total error. For example, the number of entries into SMM mode and corresponding exits out of SMM mode increases and, thus, hardware resources are diverted to servicing a significant number of SMI events thereby greatly reducing system availability and performance.

Examples disclosed herein perform memory error detection and/or correction on a memory location of interest by using SSP in combination with SMM for respective aspects of memory error detection and correction in a way that increases operating system availability while reducing unnecessary data correction. In this manner, examples disclosed herein substantially reduce or eliminate disadvantages of prior ADDDC techniques. In some disclosed examples, the memory controller utilizes an SSP to perform memory error detection (e.g., persistent memory error detection, etc.) and an SMM to perform a memory correction action (e.g., an ADDDC action, etc.). For example, the SSP may perform memory error detection by obtaining memory locations of detected errors and categorizing the memory locations with corresponding counters. The SSP may transmit a memory location pointer to the SMM when one of the counters satisfies an error threshold. The SMM may perform a memory correction action when the SMM receives the memory location pointer from the SSP. The SSP may resume memory error detection when the SMM completes the memory correction action.

FIG. 1 is an example block diagram of an example memory controller 100 and an example error analyzer 102 that can be implemented in accordance with the teachings of this disclosure to perform memory error detection and/or correction of an example memory device 104. In the illustrated example, the memory controller 100 is an example implementation of an SMM (System Management Module) and the error analyzer 102 is an example implementation of an SSP (System Service Processor). In the illustrated example, the memory device 104 is a portion of an error-correcting code (ECC) DIMM and includes memory cells 106. Alternatively, the example memory device 104 may be any other type of volatile or non-volatile memory. The memory device 104 of the illustrated example stores one binary bit value per memory cell 106. For example, memory cells (MC) (0), (1), (2), (3), (4), and (X) 106 each include a bit of data that represents either a value of 0 or a value of 1 based on a charge of a capacitor included in the memory cell 106. MC(0) 106 includes binary data that is read by the memory controller 100 as an error represented by 'E'. In the illustrated example, the error 'E' in MC(0) 106 is a persistent error. Alternatively, the error 'E' in MC(0) 106 may be a random error (e.g., a chip-level soft error such as a particle colliding with the memory cell, a system-level soft error such as noise on a data bus 108, etc.) or any other type of memory error.

In the illustrated example of FIG. 1, the memory controller 100 includes a memory monitor 110 and an error corrector 112. The memory monitor 110 monitors the memory device 104 for error status information including a memory location of a memory error. For example, the memory monitor 110 may monitor the memory device 104 by communicating with an ECC device 114. In the illustrated example, the ECC device 114 is in circuit (e.g., electrically, optically, etc.) with the memory device 104 via a bus 116. The example ECC device 114 reads the data from the memory cells 106 and determines that MC(0) 106 includes an error based on one or more ECC techniques (e.g., evaluating a parity bit, a hashing method, a Hamming code, etc.). The example ECC device 114 transmits error status information to the memory controller 100 when the ECC device 114 detects the error at MC(0) 106. In response to the example memory monitor 110 obtaining the error status information, the memory monitor 110 enables an error status pin 115 (e.g., adjust a voltage level of an ERROR_N[0] pin from a first voltage to a second voltage, etc.) on the memory monitor 110 indicating that an error has been detected.

In the illustrated example of FIG. 1, the error analyzer 102 includes an example error manager 118, an example adaptive threshold manager 120, and an example command generator 122. The example error analyzer 102 includes the error manager 118 to obtain the error status information from the memory monitor 110 when the error status pin 115 changes status (e.g., adjusting a voltage level of the ERROR_N[0] pin from a first voltage to a second voltage, etc.). For example, the error manager 118 may obtain error status pin information from the memory monitor 110 including a value (e.g., a voltage level) of the error status pin 115. In such an example, the error manager 118 may determine that the memory monitor 110 detected an error based on the value of the error status pin 115. For example, the error manager 118 may determine that the memory monitor 110 detected the error when the value of the error status pin 115 changes from zero (e.g., the error status pin 115 is disabled, a voltage level of the error status pin 115 is below a first voltage threshold (e.g., below 0.5 V, below 1.5 V, etc.), etc.) to one (e.g., the error status pin 115 is enabled, a voltage level of the error status pin 115 is above a second voltage threshold (e.g., above 3.3 V, above 4.5 V, etc.).

In the illustrated example, the error manager 118 determines MC(0) 106 to be the memory location of the error in the memory cells 106 based on the error status information. The example error manager 118 compares the memory location MC(0) 106 to a plurality of memory locations stored in an error history log 124. The example error history log 124 includes memory error location eMC addresses 126, 128, 130, 132, 134, 136 and corresponding counters 138, 140, 142, 144, 146, 148 (e.g., error counters, etc.). In the illustrated example, each of the memory error location eMC addresses 126, 128, 130, 132, 134, 136 is a memory location having a previously detected error. Additionally or alternatively, the error history log 124 may include a different number of history memory locations and/or counters than illustrated in FIG. 1. Alternatively, the example error analyzer 102 may include the example error history log 124.

In some examples, the error manager 118 updates one of the counters 138, 140, 142, 144, 146, 148 when a memory location of a detected error matches one of the memory error location eMC addresses 126, 128, 130, 132, 134, 136. In some examples, the error manager 118 generates a new counter corresponding to the memory location when the memory location does not match one of the memory error location eMC addresses 126, 128, 130, 132, 134, 136. In the illustrated example, the error manager 118 increments the eMC(0) counter 138 corresponding to the memory error location eMC(0) address 126 when the memory location of the detected error, MC(0) 106, matches the memory error location eMC(0) address 126 in the error history log 124.

In the illustrated example of FIG. 1, the error analyzer 102 includes the adaptive threshold manager 120 to compare values of the counters 138, 140, 142, 144, 146, 148 in the error history log 124 to an adaptive-time window threshold 121. In the illustrated example, the adaptive-time window threshold 121 is set to an amount of time within which two consecutive errors in a same memory location must occur to perform error correction. The example adaptive-time window threshold 121 may be based on a likely time difference between consecutive errors that correspond to a persistent error. The adaptive-time window threshold 121 may additionally or alternatively be based on a total number of innocuous, random errors that typically occur within a time window and can be safely ignored (e.g., do not need error handling using examples disclosed herein, etc.). For example, a large time difference (e.g., 100 milliseconds or greater) between consecutive errors may indicate that both consecutive errors are random errors. In another example, a small time difference (e.g., 10 microseconds or less, 20 microseconds or less, etc.) between consecutive errors may indicate that both consecutive errors are indicative of a persistent error at a corresponding memory location.

In some examples, the adaptive threshold manager 120 dynamically generates a new adaptive-time window threshold during system operation. In some instances, the adaptive threshold manager 120 dynamically changes the adaptive-time window threshold 121 one or more times over time. The adaptive aspect of the adaptive-time window threshold 121 enables the adaptive threshold manager 120 to re-evaluate the suitability of the adaptive-time window threshold 121 from time to time to more accurately identify persistent errors under different, possibly changing, conditions (e.g., operating conditions, temperature, accumulated duration (e.g., seconds, minutes, hours, days, etc.) of operation, age of device, etc.), utilization (e.g., frequency of data accesses, amount of data being stored, etc.), elevation, etc. For example, the adaptive threshold manager 120 may reduce the adaptive-time window threshold 121 from three errors in one minute to three errors in 100 milliseconds based on a change in utilization of the memory, a change in temperature, a change in elevation, etc. In some examples, the adaptive threshold manager 120 manages a plurality of adaptive-time window thresholds. For example, each of the counters 138, 140, 142, 144, 146, 148 may have one or more corresponding adaptive-time window thresholds, which may be different from each other.

In the illustrated example of FIG. 1, the error analyzer 102 includes the command generator 122 to generate a memory correction command when the adaptive threshold manager 120 determines that the counter 138 corresponding to the memory error location eMC(0) address 126 and the memory location MC(0) 106 satisfies the adaptive-time window threshold 121. The example command generator 122 generates and transmits the memory correction command to the error corrector 112 to update a value of a memory correction action register. For example, the error corrector 112 may update a value of an smisparect1 register, which is a System Management Interrupt (SMI) and Spare control register in an integrated memory controller of a CPU such as the memory monitor 110. The example error corrector 112 may update a value of the smisparect1 register to enable an error status pin (e.g., adjust a voltage level of the ERROR_N[0] pin from a first voltage to a second voltage), enable an SMI interrupt, disable an SMI interrupt, etc. In some examples, the command generator 122 includes a pointer to a memory location of interest (e.g., an address of the memory cells 106, a range of addresses of the memory cells 106, etc.) in the memory correction command. In the illustrated example, the command generator 122 transmits the memory correction command to the error corrector 112 including a pointer to the memory location MC(0) 106. Alternatively, the example command generator 122 may not include the pointer in the memory correction command. For example, the command generator 122 may transmit (1) the memory correction command not including the pointer and (2) a memory location command including the pointer to the error corrector 112.

In the illustrated example of FIG. 1, the memory controller 100 includes the error corrector 112 to perform a memory correction action such as an ADDDC action or any other type of memory correction action. For example, the error corrector 112 may perform a memory correction action as described below in connection with FIG. 4 when the error corrector 112 obtains a memory correction command from the command generator 122. In the illustrated example, the error corrector 112 receives the memory correction command from the command generator 122 including instructions to update a value of the memory correction action register. In response to updating the value, the error corrector 112 triggers an SMI to assume control of hardware resources to perform an ADDDC action on a memory area including MC(0) 106. For example, the error corrector 112 may determine that the memory location MC(0) 106 corresponds to the memory device 104 and, thus, performs the ADDDC action on the memory device 104.

Figure 2:
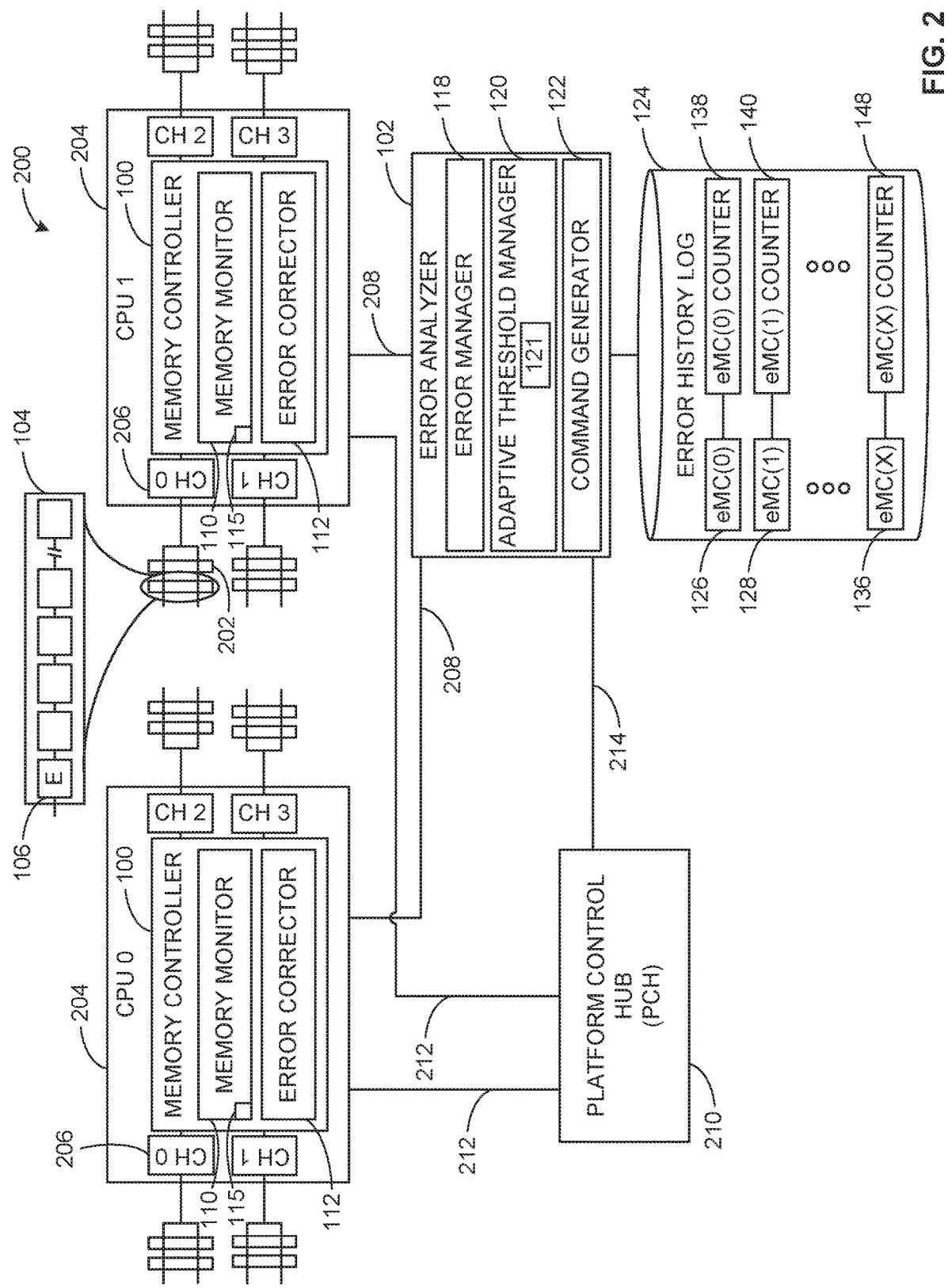
FIG. 2 illustrates an example processor system that can be implemented in accordance with the teachings of this disclosure to perform memory error detection and/or correction for memory devices.

FIG. 2 is an example block diagram illustrating an example processor system 200 that can be implemented in accordance with the teachings of this disclosure to perform memory error detection and/or correction for a memory module 202. In the illustrated example, the memory module 202 is an error-correcting code (ECC) DIMM which includes the memory device 104 and the memory cells 106 of FIG. 1. The memory modules 202 are connected to corresponding example CPUs 204 via corresponding channels 206. The example CPUs 204 include the memory controller 100 of FIG. 1. In some examples, the example channels 206 may be accessed using DIMM sockets on a processor board (e.g., a motherboard, etc.) in which the memory modules 202 are installed. The example channels 206 include data, address, and control lines that facilitate access (e.g., a read operation, a write operation, etc.) of the memory modules 202 by the memory monitor 110.

In the illustrated example of FIG. 2, the memory controllers 100 are in circuit with the error analyzer 102 of FIG. 1 via a Platform Environment Control Interface (PECI) bus 208. In the illustrated example, the error manager 118 monitors an error status pin of the memory monitor 110 and obtains the error status information from the memory monitor 110 via the PECI bus 208 when the error status pin 115 changes status. In the illustrated example, the command generator 122 transmits a command (e.g., a command to update a value of a register, a command to transmit a pointer of a memory location, etc.) to the error corrector 112 via the PECI bus 208.

In the illustrated example of FIG. 2, the CPUs 204 are in circuit with a platform control hub (PCH) 210 via a PCH bus 212. The PCH 210 performs various functions such as clocking (e.g., generating a clock for the processor system 200, etc.). For example, the memory monitor 110 may obtain an error occurrence timestamp (e.g., a clock value of the processor system 200, etc.) via the PCH bus 212 and map the error occurrence timestamp to the detected error in the memory cell 106. In the illustrated example, the memory monitor 110 transmits the error status information including the detected error and the corresponding error occurrence timestamp to the error manager 118.

In the illustrated example of FIG. 2, the PCH 210 is in circuit with the error analyzer 102 via a PCH bus 214. For example, the error manager 118 may obtain the error occurrence timestamp value from the PCH 210 via the PCH bus 214 and map the error occurrence timestamp value to one of the counters 138, 140, 142, 144, 146, 148 in the error history log 124. In some examples, the adaptive threshold manager 120 analyzes a plurality of error occurrence timestamps mapped to the counters 138, 140, 142, 144, 146, 148 to generate a new adaptive-time window threshold or change the adaptive-time window threshold 121. For example, the adaptive threshold manager 120 may calculate a time difference between a first error occurrence timestamp mapped to the eMC(0) counter 138 and a second error occurrence timestamp mapped to the eMC(0) counter 138. The example adaptive threshold manager 120 may determine whether the time difference satisfies the adaptive-time window threshold 121. The example command generator 122 may transmit a memory correction command to the error corrector 112 via the PECI bus 208 when the time difference satisfies the adaptive-time window threshold 121.

Figure 3:
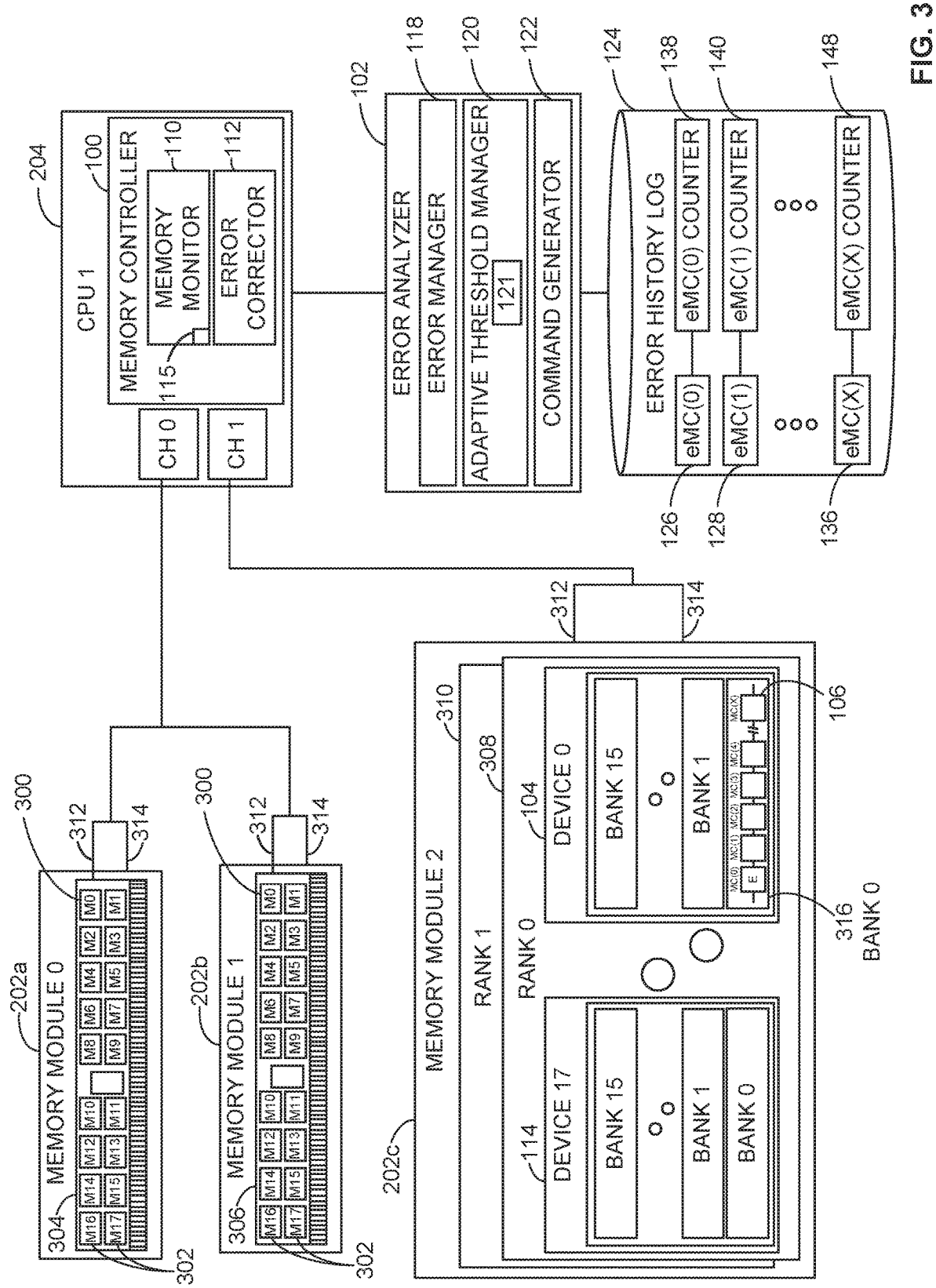
FIG. 3 illustrates example memory modules in circuit with the memory controller of FIGS. 1 and/or 2.

FIG. 3 illustrates the example memory controller 100 in circuit with the example error analyzer 102 of FIGS. 1 and 2 to perform memory error detection and/or correction of the memory modules 202a-c of FIG. 2. The example memory modules 202a-c are configured for use with error-correcting code (ECC) error detection and/or correction features. For example, the memory modules 202a-c are implemented using ECC SDRAM and are provided with memory chips to store data and separate memory chips to store error-correcting codes. For example, a non-ECC SDRAM DIMM may have two ranks and 16 memory devices per rank, totaling 32 memory devices per DIMM module to store data. In the illustrated example, each ECC SDRAM DIMM 202a-b has two ranks and 18 memory devices per rank of which 16 memory devices are data devices (e.g., memory devices 300 designated by M0-M15 of the memory modules 202a-c, the memory device 104, etc.), and two memory devices are ECC devices (e.g., the memory devices 302 designated by M16-M17 of the memory modules 202, the ECC memory device 114, etc.). For example, the ECC devices 114, 302 may store single-bit error correction double-bit error detection (SEC-DED) codes to enable correcting single-bit errors and detecting double-bit errors. Additionally or alternatively, other types of error correcting codes may be used.

In the illustrated example, the memory modules 202 include sets of DRAM chips connected to the same address and data buses. Each set of DRAM chips forms a rank. For example, the memory devices 300, 302 designated by M0-M17 of memory module 0 202a form a rank 304 and the memory devices 300, 302 designated by M0-M17 of memory module 1 202b form a rank 306. In the illustrated example, a set of 18 16-bit DRAM chips (e.g., the memory devices 300, 302 designated by M0-M17 of memory module 0 202a, etc.) forms a 288-bit rank (e.g., 18×16 bits/memory device=288-bit data width). In other examples, a rank includes fewer or more memory chips, or one memory chip. As all ranks share the same data bus, only one rank may be accessed at any given time. For example, a rank 308 may be accessed when the CPU 204 activates a chip select signal of the rank 308. All other ranks are deactivated for the duration of an operation (e.g., a read operation, a write operation, etc.) conducted on the activated rank 308. For example, a rank 310 is deactivated for the duration of the operation on the rank 308 based on the CPU deactivating a chip select signal of the rank 310. In the illustrated example, the operation is conducted using a primary data bus 312 and a secondary data bus 314. In other examples, the operation is conducted using fewer or more data buses.

In the illustrated example of FIG. 3, memory module 2 202c includes the memory device 104, the memory cells 106, and the ECC device 114 of FIG. 1. The memory device 104 includes 16 banks. In other examples, the memory device 104 may include fewer or more banks, or one bank. For example, the memory device 104 which includes 16 banks also includes four bank select lines for use in selectively accessing each of the banks. A bank includes rows and columns of data storage units (e.g., memory cells). For example, each bank in a memory chip has the same number of memory cells such that a size of each bank in a chip may be determined by dividing a total number of memory cells in the chip by a number of banks in the chip. When multiple memory chips are arranged together in a rank, corresponding memory banks are concatenated across the numerous memory devices. For example, bank 0 316 of each of the memory devices M0-M17 in the rank 308 of memory module 2 202c are in circuit with each other.

In some examples, DRAM devices such as the memory device 104 experience memory device failures such as soft errors and hard errors. A soft error or a hard error in the memory device 104 can lead to catastrophic failure of the corresponding processor system 200. As used herein, the terms "soft error" and "random error" are used interchangeably to refer to an error resulting from data stored at a given memory location changing inadvertently to erroneous data infrequently or as a rare occurrence such that subsequent data can be stored to the same location without error. In some examples, soft errors are caused by loss of charge in a memory cell of the DRAM device (e.g., the memory cell 106 of the memory device 104, etc.). As used herein, the terms "hard error" and "persistent error" are used interchangeably to refer to an error in which data can no longer reliably be stored at a given memory location. As used herein, the term "memory location" refers to a location in a memory defined by one or more memory cell locations within a specified bank, device, rank, module, channel, etc. and/or a combination thereof. For example, a memory location may be the memory cell 106 located within the bank 316 of the memory device 104, where the memory device 104 corresponds to the rank 308 of the memory module 2 202c.

Figure 4:
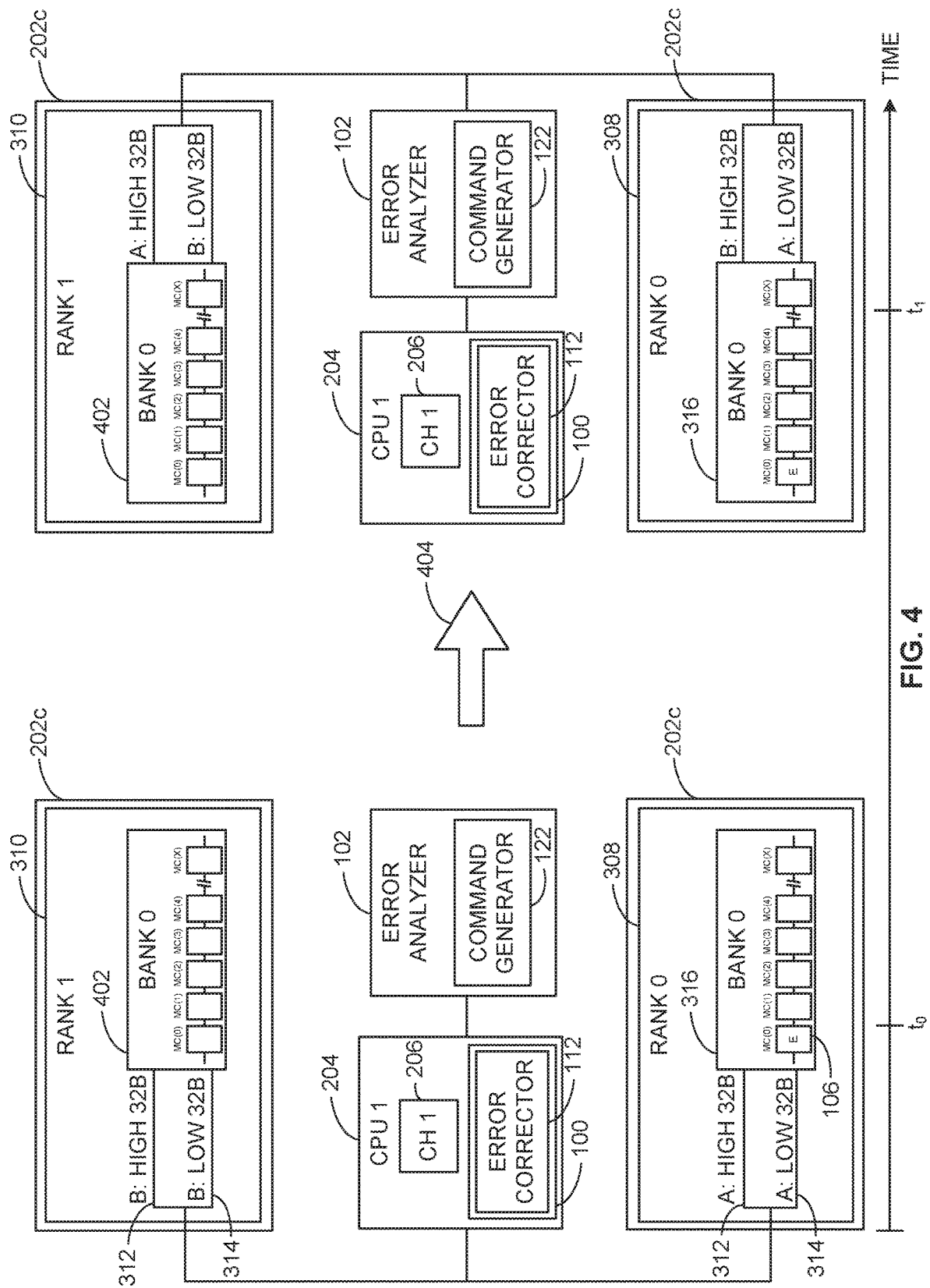
FIG. 4 illustrates an example memory correction action of a memory device in accordance with the teachings of this disclosure.

FIG. 4 illustrates the example error corrector 112 in circuit with the ranks 308, 310 of the memory module 2 202c to perform an example memory correction action on bank 0 316 based on lockstep partnerships between memory devices. Lockstep partnerships associate error correction data across memory regions (e.g., memory banks, memory ranks, etc.) in a lockstep manner such that reading data from memory results in a detection and/or a correction of a memory error. Examples disclosed herein implement memory correction actions using lockstep partnership techniques. In the illustrated example, the memory correction action is an ADDDC action. At a first time instance $t_0$, the example error corrector 112 triggers an SMI and performs the ADDDC action when the error corrector 112 receives a memory correction action command generated by the example command generator 122. The memory correction action command includes a memory location of a detected error. In the illustrated example, the memory location is the memory cell 106 designated by 'E'. In response to the example error corrector 112 determining the memory location from the memory correction action command, the error corrector 112 performs a memory correction action on the memory location. In the illustrated example, the error corrector 112 performs a memory correction action on the bank 0 316 of the rank 0 308. The example error corrector 112 performs the memory correction action by performing a read operation of the bank 316 of the rank 308 and bank 402 of the rank 310 via corresponding ones of the primary data bus 312 and the secondary data bus 314. In the illustrated example, the error corrector 112 reads the high 32 bytes of the banks 316, 402 on the primary data bus 312 and reads the low 32 bytes of the banks 316, 402 on the secondary data bus 314. In response to the reading of the data of the banks 316, 402 on the data buses 312, 314, the example error corrector 112 uses one or more adaptive virtual lockstep (AVL) rules to define one or more lockstep partnerships between the banks 316, 402 based on the detected error in the memory cell 106.

At a second time instance $t_1$, the example error corrector 112 re-arranges the data read from the data buses 312, 314 based on the one or more lockstep relationships before writing the re-arranged data back to the banks 316, 402 as illustrated to the right of the arrow 404. In the illustrated example, the error corrector 112 writes the high 32 bytes of the bank 0 316 of the rank 0 308 to the bank 0 402 of the rank 1 310. Similarly, the example error corrector 112 writes the high 32 bytes of the bank 0 402 of the rank 1 310 to the bank 0 316 of the rank 0 308. As a result, the error correction of the banks 316, 402 is spread over the ranks 308, 310.

In some examples, the error corrector 112 reverses and reassigns the one or more lockstep partnerships to fix additional memory errors when subsequent detected errors in the memory cells 106 satisfy an adaptive-time window threshold (e.g., the adaptive-time window threshold 121, etc.) corresponding to the memory location including the memory cells 106. For example, the adaptive-time window threshold 121 may be satisfied to trigger a corrective action by the error corrector 112 when more than a threshold number of errors are detected in the memory cells 106 within a 100 millisecond time window (e.g., the adaptive-time window threshold 121).

Lockstep partnerships can be configured for different memory error detection granularities. A memory error detection granularity refers to a data unit size (e.g., a bank, a rank, a memory device, etc.) to which memory error detection in examples disclosed herein can be implemented and/or to which a lockstep partnership can be formed. For example, memory error detection of the bank 0 316 has memory error detection bank granularity. In another example, a lockstep partnership that spans the rank 0 308 and the rank 1 310 has memory error detection rank granularity. The example error corrector 112 can be configured to change the memory error detection granularity of the one or more lockstep partnerships when changing partnerships. Such changing of memory error detection granularity is useful when determining an appropriate escalation of a memory correction action based on a memory location of detected errors. For example, the error corrector 112 may change the memory error detection granularity from bank granularity to rank granularity to determine whether to perform a memory correction action on the bank 0 316 (e.g., the bank 0 316 is faulty, damaged, etc.) or perform a memory correction action on the memory module 2 202c (e.g., the memory module 2 202c is faulty, damaged, etc.). For example, the memory error detection granularity of a first set of lockstep partnerships may be of bank granularity (e.g., the banks 316, 402, etc.), while a second set of lockstep partnerships may be of rank granularity (e.g., the ranks 308, 310, etc.), where the second set is formed after the first set is formed and subsequently reversed. For example, the error corrector 112 may reverse and reassign the first set of lockstep partnerships when more than two errors are detected in the bank 0 316. In another example, the error corrector 112 may reverse and reassign the second set of lockstep partnerships when more than two errors are detected in the rank 308.

Figure 5:
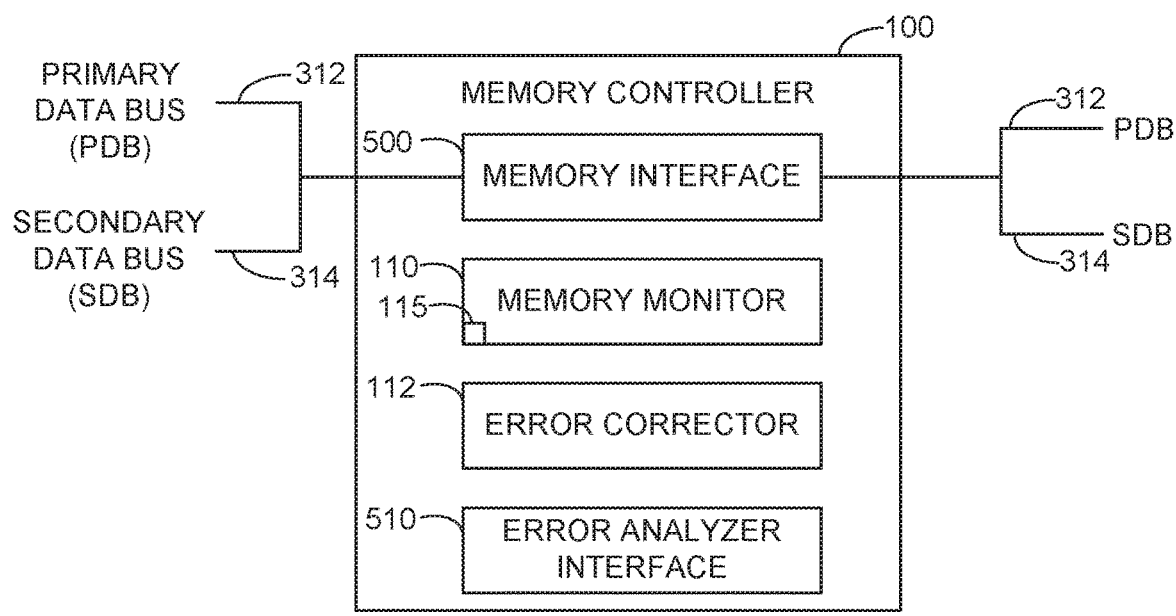
FIG. 5 is an example block diagram of the example memory controller of FIGS. 1-4 that can be implemented in accordance with the teachings of this disclosure.

FIG. 5 is a block diagram of the example memory controller 100 of FIGS. 1-4. The example memory controller 100 monitors the memory modules 202 of FIGS. 2-4 to detect memory errors. The example memory controller 100 transmits error status information including a memory location of a memory error to the example error analyzer 102 of FIGS. 1-4. The example memory controller 100 performs a memory correction action when the memory controller 100 receives a memory correction command from the example error analyzer 102. In the illustrated example, the memory controller 100 includes an example memory interface 500, the example memory monitor 110, the example error corrector 112, and an example error analyzer interface 510.

In the illustrated example of FIG. 5, the memory controller 100 includes the memory interface 500 to obtain error status information from the memory modules 202. For example, the memory interface 500 may obtain a memory location of a memory error from the ECC device 114 of FIGS. 1 and 3 via the primary data bus (PDB) 312 and the secondary data bus (SDB) 314. In some examples, the memory interface 500 facilitates access (e.g., a read operation, a write operation, etc.) of the memory modules 202. For example, the memory interface 500 may read data of interest from the memory modules 202. In examples, the memory interface 500 may write re-arranged data to the memory modules 202 based on one or more AVL rules.

In the illustrated example of FIG. 5, the memory controller 100 includes the memory monitor 110 to monitor the memory modules 202 to detect memory errors. For example, the memory monitor 110 may determine whether the error status information obtained by the memory interface 500 includes a memory error. In some examples, the memory monitor 110 enables an error status pin (e.g., adjusting a voltage level of an ERROR_N[0] pin from a first voltage to a second voltage, etc.) indicating that the error status information includes a memory error. In such examples, the memory monitor 110 obtains an error occurrence timestamp via the PCH bus 212 of FIG. 2 and maps the error occurrence timestamp to the detected error.

In the illustrated example of FIG. 5, the memory controller 100 includes the error corrector 112 to perform a memory correction action. In some examples, the error corrector 112 updates a value of an smisparect1 register in response to receiving a memory correction command from the command generator 122 of FIGS. 1-4. In some examples, the error corrector 112 enables or disables an SMI interrupt. For example, the error corrector 112 may enable an SMI interrupt to assume control of hardware resources to perform an ADDDC action on a memory area including MC(0) 106. The example error corrector 112 may disable the SMI interrupt to release control of the hardware resources in response to the error corrector 112 completing the ADDDC action.

In some examples, the error corrector 112 determines whether a memory region (e.g., a rank, a bank, etc.) including a detected error was previously subjected to a memory correction action such as an AVL process. For example, the error corrector 112 may determine that the bank 0 316 of FIGS. 3-4 is governed by one or more AVL rules, lockstep partnerships, etc. In some examples, the error corrector 112 determines whether to perform a memory correction action or to move affected data to a spare region of an ECC device. For example, the error corrector 112 may compare a number of corrected errors in the bank 0 316, a number of corrected errors in the rank 0 308, etc. to a corrected errors threshold (e.g., more than two corrected errors in the bank 0 316, more than two corrected errors in the rank 0 308, etc.) and determine whether the number of corrected errors satisfies the corrected errors threshold. If the example error corrector 112 determines that the number of corrected errors does not satisfy the corrected errors threshold, then the error corrector 112 may perform an ADDDC action (e.g., form a lockstep partnership, reverse a lockstep partnership, etc.), an ECC algorithm, etc. on the bank 0 316. If, the example error corrector 112 determines that the number of corrected errors does satisfy the corrected errors threshold, then the error corrector 112 may map or move the data in the bank 0 316 to a spare region or a spare bank in the ECC device 114.

In the illustrated example of FIG. 5, the memory controller 100 includes the error analyzer interface 510 to transmit to and obtain information from the error analyzer 102 of FIGS. 1-4. For example, the error analyzer interface 510 may transmit error status information including a memory location of a detected error to the error analyzer 102 via the PECI bus 208 of FIG. 2. In another example, the error analyzer interface 510 may obtain a memory correction command from the error analyzer 102 via the PECI bus 208.

While an example manner of implementing the memory controller 100 of FIGS. 1-4 is illustrated in FIG. 5, one or more of the elements, processes and/or devices illustrated in FIG. 5 may be combined, divided, re-arranged, omitted, eliminated, and/or implemented in any other way. Further, the example memory interface 500, the example memory monitor 110, the example error corrector 112, the example error analyzer interface 510 and/or, more generally, the example memory controller of FIGS. 1-4 may be implemented by hardware, software, firmware, and/or any combination of hardware, software, and/or firmware. Thus, for example, any of the example memory interface 500, the example memory monitor 110, the example error corrector 112, the example error analyzer interface 510 and/or, more generally, the example memory controller of FIGS. 1-4 could be implemented by one or more analog or digital circuit(s), logic circuits, programmable processor(s), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example memory interface 500, the example memory monitor 110, the example error corrector 112, the example error analyzer interface 510 and/or, more generally, the example memory controller of FIGS. 1-4 is/are hereby expressly defined to include a non-transitory computer readable storage device or storage disk such as a memory, a digital versatile disk (DVD), a compact disk (CD), a Blu-ray disk, etc. including the software and/or firmware. Further still, the example memory controller of FIGS. 1-4 may include one or more elements, processes, and/or devices in addition to, or instead of, those illustrated in FIG. 5, and/or may include more than one of any or all of the illustrated elements, processes, and devices.

Figure 6:
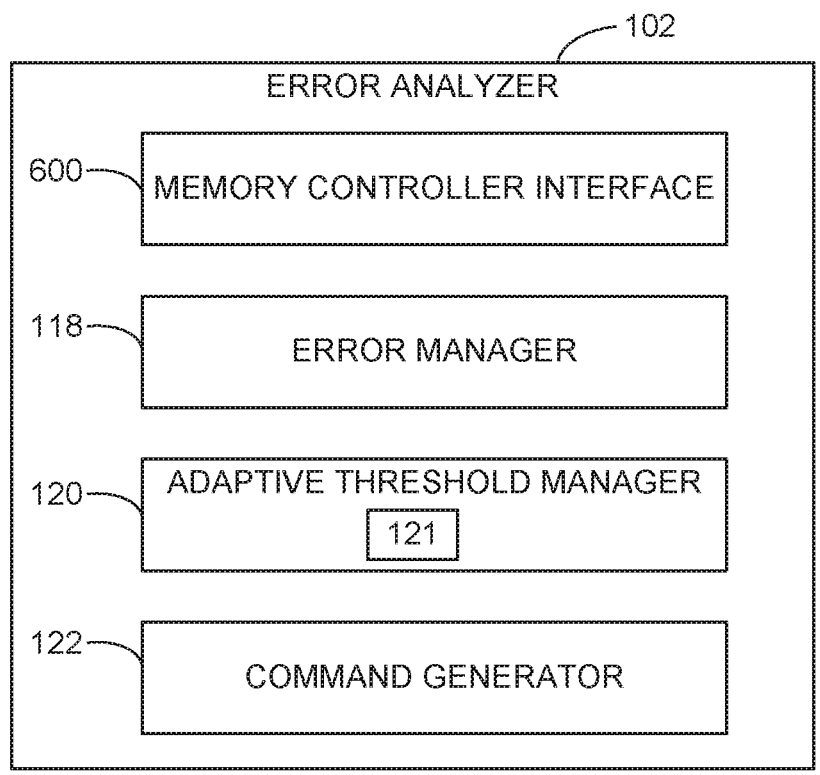
FIG. 6 is an example block diagram of the example error analyzer of FIGS. 1-4 that can be implemented in accordance with the teachings of this disclosure.

FIG. 6 is a block diagram of the example error analyzer 102 of FIGS. 1-4. The example error analyzer 102 evaluates detected errors in obtained error status information and determines whether to generate a memory correction command. In the illustrated example, the error analyzer 102 includes an example memory controller interface 600, the example error manager 118, the example adaptive threshold manager 120, which includes the example adaptive-time window threshold 121, and the example command generator 122.

In the illustrated example of FIG. 6, the error analyzer 102 includes the memory controller interface 600 to monitor the error status pin 115 of the memory controller 100 of FIGS. 1-5 and obtain error status information from the memory controller 100 when the error status pin 115 changes status (e.g., adjusting a voltage level of the ERROR_N[0] pin from a first voltage to a second voltage, etc.). For example, the memory controller interface 600 may obtain a memory location of a memory error from the error analyzer interface 510 of FIG. 5 via the PECI bus 208 of FIG. 2 when the ERROR_N[0] pin is enabled. In some examples, the memory controller interface 600 determines whether to continue monitoring the error status pin 115. For example, the memory controller interface 600 may determine that the memory controller 100 has been powered off (e.g., a heartbeat register is no longer updating, etc.).

In the illustrated example of FIG. 6, the error analyzer 102 includes the error manager 118 to compare a memory location of a memory error to a plurality of memory locations stored in the error history log 124. In some examples, the error manager 118 updates one of the counters 138, 140, 142, 144, 146, 148 of FIG. 1 when the memory location matches one of the memory error location eMC addresses 126, 128, 130, 132, 134, 136. In some examples, the error manager 118 generates a new counter corresponding to the memory location when the memory location does not match one of the memory error location eMC addresses 126, 128, 130, 132, 134, 136.

In the illustrated example of FIG. 6, the error analyzer 102 includes the adaptive threshold manager 120 to compare values of the counters 138, 140, 142, 144, 146, 148 in the error history log 124 to the adaptive-time window threshold 121. In some examples, the adaptive threshold manager 120 dynamically generates a new adaptive-time window threshold during system operation. In some examples, the adaptive threshold manager 120 dynamically changes the adaptive-time window threshold 121 one or more times over time. In some examples, the adaptive threshold manager 120 manages a plurality of adaptive-time window thresholds. In such examples, each adaptive-time window threshold corresponds to a respective one of the eMC addresses 126, 128, 130, 132, 134, 136 and/or the eMC counters 138, 140, 142, 144, 146, 148 of FIG. 1.

In the illustrated example of FIG. 6, the error analyzer 102 includes the command generator 122 to generate a memory correction command when the adaptive threshold manager 120 determines that a value of one of the counters 138, 140, 142, 144, 146, 148 satisfies the adaptive-time window threshold 121. In some examples, the command generator 122 generates and transmits the memory correction command to the error corrector 112 to update a value of a memory correction action register (e.g., an smisparect1 register, etc.) via the PECI bus 208.

While an example manner of implementing the error analyzer 102 of FIGS. 1-4 is illustrated in FIG. 6, one or more of the elements, processes and/or devices illustrated in FIG. 6 may be combined, divided, re-arranged, omitted, eliminated, and/or implemented in any other way. Further, the example memory controller interface 600, the example error manager 118, the example adaptive threshold manager 120, the example command generator 122 and/or, more generally, the example error analyzer 102 of FIGS. 1-4 may be implemented by hardware, software, firmware, and/or any combination of hardware, software, and/or firmware. Thus, for example, any of the example memory controller interface 600, the example error manager 118, the example adaptive threshold manager 120, the example command generator 122 and/or, more generally, the example error analyzer 102 of FIGS. 1-4 could be implemented by one or more analog or digital circuit(s), logic circuits, programmable processor(s), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example memory controller interface 600, the example error manager 118, the example adaptive threshold manager 120, the example command generator 122 and/or, more generally, the example error analyzer 102 of FIGS. 1-4 is/are hereby expressly defined to include a non-transitory computer readable storage device or storage disk such as a memory, a digital versatile disk (DVD), a compact disk (CD), a Blu-ray disk, etc. including the software and/or firmware. Further still, the example error analyzer 102 of FIGS. 1-4 may include one or more elements, processes, and/or devices in addition to, or instead of, those illustrated in FIG. 6, and/or may include more than one of any or all of the illustrated elements, processes, and devices.

Figure 7:
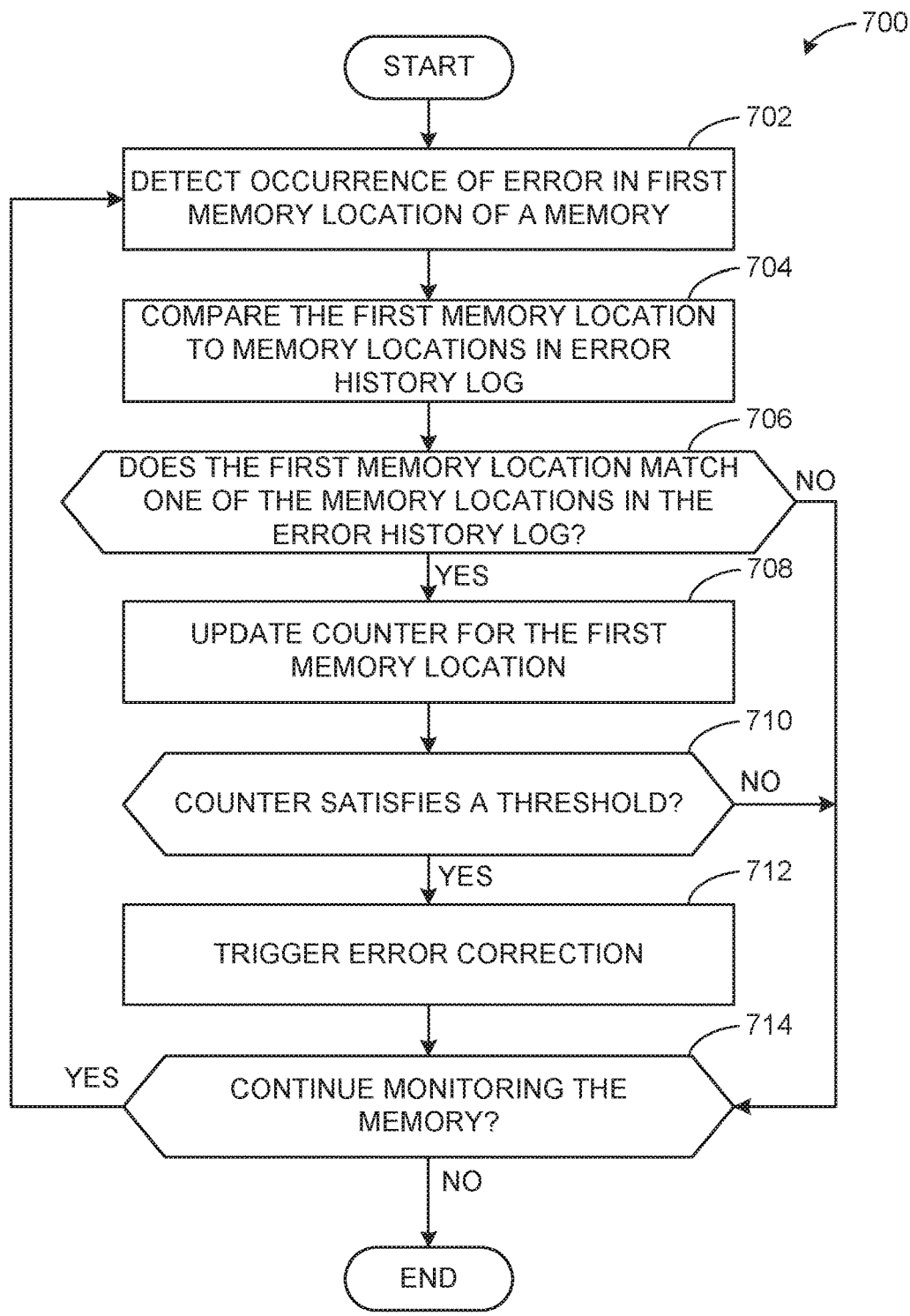
FIG. 7 is a flow diagram representative of an example process implemented by the example error analyzer of FIGS. 1-4 and 6 to perform memory error detection and/or correction for memory devices.
Figure 8:
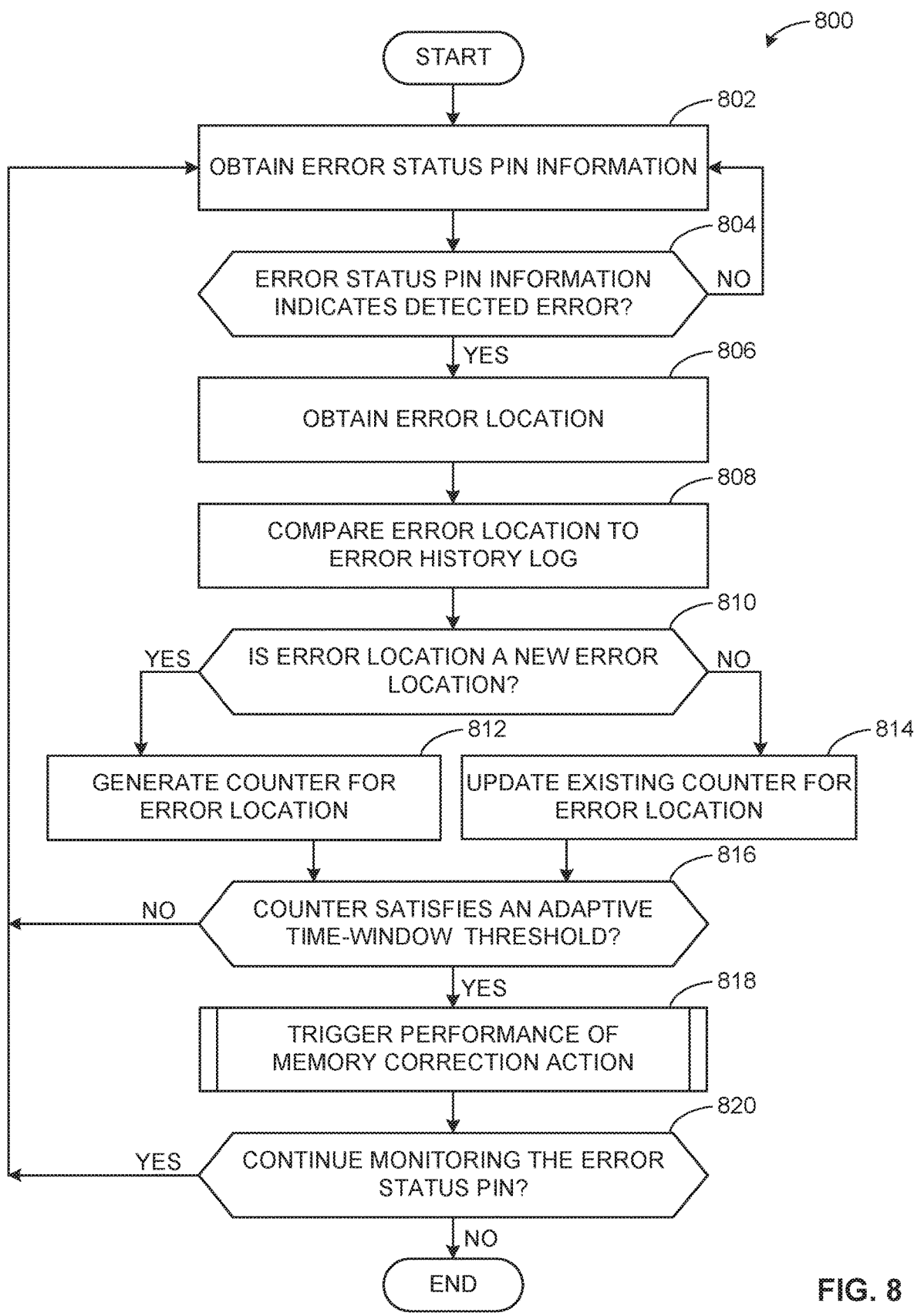
FIG. 8 is a flow diagram representative of an example process implemented by the example error analyzer of FIGS. 1-4 and 6 to perform memory error detection for memory devices.
Figure 9:
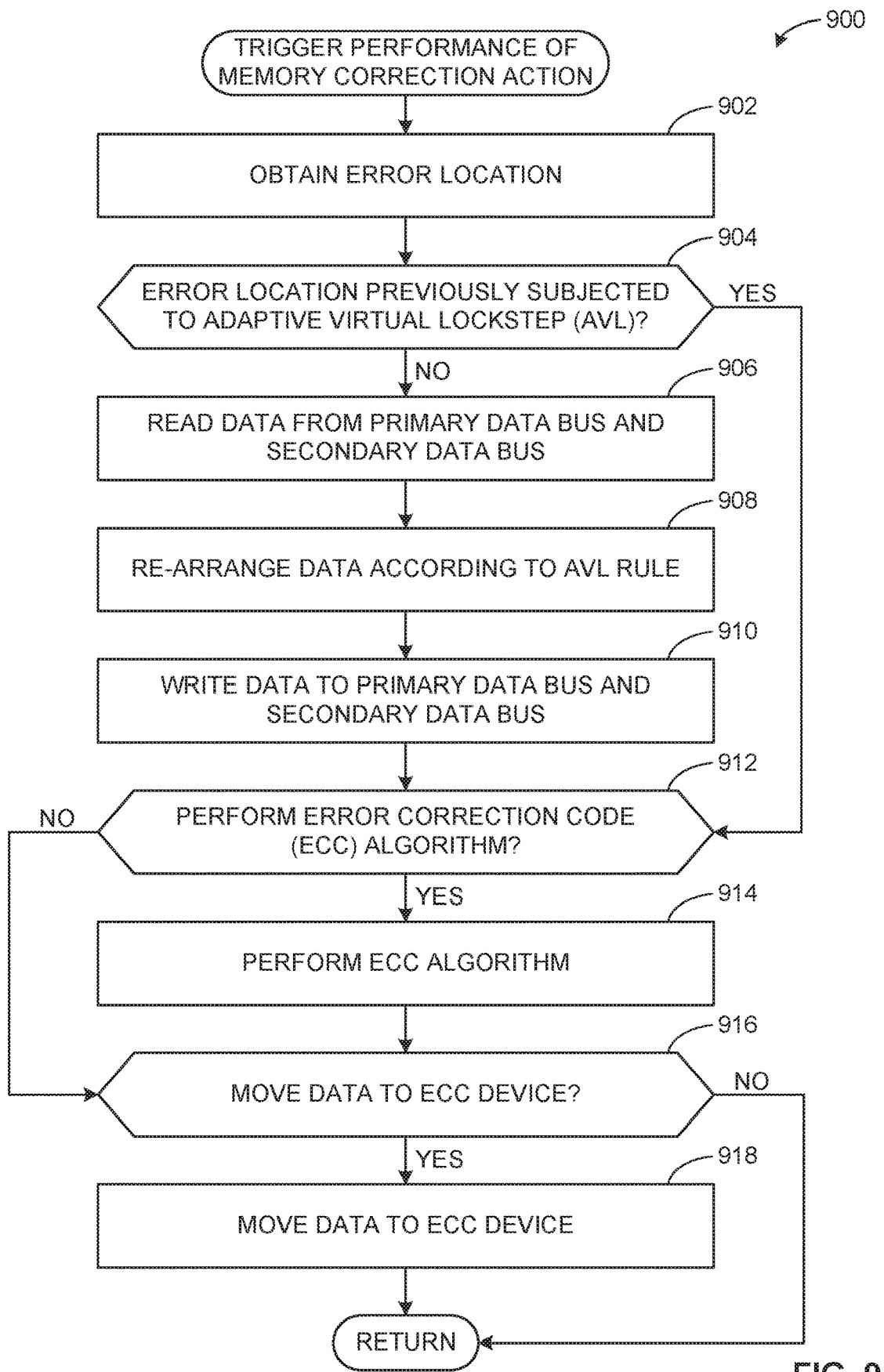
FIG. 9 is a flow diagram representative of an example process implemented by the example memory controller of FIGS. 1-5 to perform memory error correction for memory devices.

Flowcharts of FIGS. 7-9 are representative of example operations performed by the example memory controller 100 of FIGS. 1-5 and/or the example error analyzer 102 of FIGS. 1-4 and 6. In some examples, the operations are performed by hardware (e.g., analog and/or logic circuits including transistor and/or logic gates, etc.) configured to implement error detection and/or correction techniques in accordance with teachings of this disclosure. In such examples, hardware circuits may be used to implement the example memory controller 100 of FIGS. 1-5 and/or the example error analyzer 102 of FIGS. 1-4 and 6 to achieve high speed memory operations that are conducive to high speed data throughputs for high-performance memories. In other examples, the flowcharts of FIGS. 7-9 are representative of example machine readable instructions for implementing the example memory controller 100 of FIGS. 1-5 and/or the example error analyzer 102 of FIGS. 1-4 and 6. In these examples, the machine readable instructions comprise a program for execution by a processor such as the processors 1012, 1112 shown in the example processor platforms 1000, 1100 discussed below in connection with FIGS. 10-11. The program may be embodied in software stored on a non-transitory computer readable storage medium such as a CD-ROM, a floppy disk, a hard drive, a digital versatile disk (DVD), a Blu-ray disk, or a memory associated with the processors 1012, 1112, but the entire program and/or parts thereof could alternatively be executed by a device other than the processors 1012, 1112 and/or embodied in firmware or dedicated hardware. Further, although the example program is described with reference to the flowcharts illustrated in FIGS. 7-9, many other methods of implementing the example memory controller 100 and/or the example error analyzer 102 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example methods of FIGS. 7-9 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable storage medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

FIG. 7 is a flowchart representative of an example method 700 that may be performed by the example error analyzer 102 of FIGS. 1-4 and 6 to detect and correct a memory error in a memory device. The example method 700 begins at block 702 when the example error analyzer 102 detects an occurrence of an error in a first memory location of a memory. For example, the memory controller interface 600 may obtain error status information from the error analyzer interface 510 indicating that the memory location MC(0) 106 includes an error. In such an example, the memory controller interface 600 may obtain the error status information when the error status pin 115 (e.g., the ERROR_N[0] status pin, etc.) of the memory monitor 110 changes status.

At block 704, the example error analyzer 102 compares the first memory location identified at block 702 to memory locations in an error history log. For example, the error manager 118 may compare the memory location MC(0) 106 to the memory error location eMC addresses 126, 128, 130, 132, 134, 136 in the error history log 124 of FIG. 1. At block 706, the example error analyzer 102 determines whether the first memory location matches one of the memory locations in the error history log 124. For example, the error manager 118 may determine that the memory location MC(0) 106 matches the memory error location eMC(0) address 126 (FIG. 1).

If, at block 706, the example error analyzer 102 determines that the first memory location does not match one of the memory locations in the error history log 124, control proceeds to block 714 to determine whether to continue monitoring the memory. If, at block 706, the example error analyzer 102 determines that the first memory location does match one of the memory locations in the error history log, then, at block 708, the error analyzer 102 updates a counter for the first memory location. For example, the error manager 118 may increment the eMC(0) counter 138 (FIG. 1) corresponding to the memory error location eMC(0) address 126 corresponding to the memory location MC(0) 106.

At block 710, the example error analyzer 102 determines whether the counter satisfies a threshold. For example, the adaptive threshold manager 120 may determine that the eMC(0) counter 138 satisfies the adaptive-time window threshold 121 (FIGS. 1 and 6). If, at block 710, the example error analyzer 102 determines that the counter does not satisfy the threshold, control proceeds to block 714 to continue monitoring the memory. If, at block 710, the example error analyzer 102 determines that the counter does satisfy the threshold, then, at block 712, the error analyzer 102 triggers error correction. For example, the command generator 122 may generate a memory correction command to direct the error corrector 112 to perform an ADDDC action.

At block 714, the example error analyzer 102 determines whether to continue monitoring the memory. For example, the memory controller interface 600 may determine that the memory controller 100 is no longer powered or is in an inactive state. If, at block 714, the error analyzer 102 determines to continue monitoring the memory, control returns to block 702 to continue detecting for an occurrence of an error, otherwise the example method 700 concludes.

FIG. 8 is a flowchart representative of an example method 800 that may be performed by the example error analyzer 102 of FIGS. 1-4 and 6 to detect and correct a memory error in a memory device (e.g., the memory device 104 of FIG. 1, etc.). The example method 800 begins at block 802 when the example error analyzer 102 obtains error status pin information. For example, the memory controller interface 600 (FIG. 6) may obtain a value of the error status pin 115 (e.g., a voltage level of the ERROR_N[0] status pin, etc.) of the memory monitor 110 (FIGS. 1 and 5).

At block 804, the example error analyzer 102 determines whether the error status pin information indicates a detected error. For example, the memory controller interface 600 may determine that the memory monitor 110 detected an error based on the value of the error status pin 115.

If, at block 804, the example error analyzer 102 determines that the error status pin information does not indicate a detected error, control returns to block 802 to obtain additional error status pin information. If, at block 804, the example error analyzer 102 determines that the error status pin information does indicate a detected error, then, at block 806, the error analyzer 102 obtains an error location. For example, the memory controller interface 600 may obtain error status information from the memory monitor 110 via the PECI bus 208 (FIG. 2). In such examples, the error manager 118 (FIGS. 1-3 and 5) may determine that the memory location MC(0) 106 (FIGS. 1-4) includes the detected error based on the obtained error status information.

At block 808, the example error analyzer 102 compares the error location to an error history log. For example, the error manager 118 may compare the memory location MC(0) 106 to the memory error location eMC addresses 126, 128, 130, 132, 134, 136 in the error history log 124 (FIG. 1). At block 810, the example error analyzer 102 determines if the error location is a new error location. For example, the error manager 118 may determine that the memory location MC(0) 106 is not a new error location when the memory location MC(0) 106 matches the memory error location eMC(0) address 126 in the error history log 124.

If, at block 810, the example error analyzer 102 determines that the error location is a new error location, then, at block 812, the error analyzer 102 generates a counter for the error location. For example, the error manager 118 may generate a new counter (e.g., one of the counters 138, 140, 142, 144, 146, 148 of FIG. 1) corresponding to the memory location MC(0) 106 if the memory location MC(0) 106 does not match one of the memory error location eMC addresses 126, 128, 130, 132, 134, 136 in the error history log 124.

If, at block 810, the example error analyzer 102 determines that the error location is not a new error location, then, at block 814, the error analyzer 102 updates an existing counter for the error location. For example, the error manager 118 may update the eMC(0) counter 138 (FIG. 1) corresponding to the memory error location eMC(0) address 126 when the memory location MC(0) 106 matches the memory error location eMC(0) address 126.

At block 816, the example error analyzer 102 determines whether the counter satisfies an adaptive time-window threshold. For example, the adaptive threshold manager 120 (FIGS. 1-3 and 6) may compare the eMC(0) counter 138 to the adaptive-time window threshold 121 (FIGS. 1-3 and 6) and determine whether the eMC(0) counter 138 satisfies the adaptive-time window threshold 121.

If, at block 816, the example error analyzer 102 determines that the counter does not satisfy the adaptive time-window threshold, control returns to block 802 to obtain additional error status pin information. If, at block 816, the example error analyzer 102 determines that the counter does satisfy the adaptive-time window threshold, then, at block 818, the error analyzer 102 triggers a performance of a memory correction action. For example, the command generator 122 (FIGS. 1-4 and 6) may generate and transmit a memory correction command to direct the error corrector 112 to perform an ADDDC action.

At block 820, the example error analyzer 102 determines whether to continue monitoring the error status pin 115. For example, the memory controller interface 600 (FIG. 6) may determine to continue monitoring the error status pin 115 of the memory monitor 110. If, at block 820, the example error analyzer 102 determines to continue monitoring the error status pin 115, control returns to block 802 to obtain additional error status pin information, otherwise the example method 800 concludes.

Additional detail in connection with triggering a memory correction action (FIG. 8, block 818) is shown in FIG. 9. FIG. 9 is a flowchart representative of an example method 900 that may be performed by the example memory controller 100 of FIGS. 1-5 to correct a memory error in a memory device. The example method 900 begins at block 902 when the example memory controller 100 obtains an error location. For example, the error analyzer interface 510 (FIG. 5) may obtain a memory correction command from the command generator 122 via the PECI bus 208 (FIG. 2). In such examples, the error corrector 112 (FIGS. 1-5) may determine that the error location is the memory location MC(0) 106 based on information in the memory correction command.

At block 904, the example memory controller 100 determines whether the error location was previously subjected to adaptive virtual lockstep (AVL). For example, the error corrector 112 may determine that the memory location MC(0) 106 is in the bank 0 316 (FIG. 3) governed by an AVL rule, a lockstep partnership, etc. In such an example, the error corrector 112 may determine that the bank 0 316 is in a lockstep partnership with the bank 0 402.

If, at block 904, the example memory controller 100 determines that the error location was previously subjected to AVL, control proceeds to block 912 to determine whether to perform an error correction code (ECC) algorithm. If, at block 904, the example memory controller 100 determines that the error location was not previously subjected to AVL, then, at block 906, the memory controller 100 reads data from a primary data bus and a secondary data bus. For example, the memory interface 500 (FIG. 5) may read data from the bank 0 316 via the primary data bus 312 and the secondary data bus 314 (FIGS. 3 and 5).

At block 908, the example memory controller 100 re-arranges the data according to an AVL rule. For example, the error corrector 112 may re-arrange the data according to one or more AVL rules, lockstep partnerships, etc. At block 910, the example memory controller 100 writes the data to the primary data bus and the secondary data bus. For example, the memory interface 500 may write the re-arranged data back to the bank 0 316 via the data buses 312, 314.

At block 912, the example memory controller 100 determines whether to perform an error correction code (ECC) algorithm. For example, the error corrector 112 may determine that it cannot perform an ECC algorithm because a number of errors corrected in the rank 308 of FIGS. 3-4 including the memory location MC(0) 106 has satisfied a corrected errors threshold (e.g., more than two errors have been corrected in the rank 308, etc.).

If, at block 912, the example memory controller 100 determines not to perform an ECC algorithm, control proceeds to block 916 to determine whether to move the data to an ECC device. However, if, at block 912, the example memory controller 100 determines to perform an ECC algorithm, then, at block 914, the memory controller 100 performs an ECC algorithm. For example, the error corrector 112 may perform an ECC algorithm to correct the error in the memory location MC(0) 106.

At block 916, the example memory controller 100 determines whether to move the data to an ECC device. For example, the error corrector 112 may determine to move the data to a spare region in the ECC device 114 if the number of corrected errors in the rank 308 has satisfied the corrected errors threshold. If, at block 916, the example memory controller 100 determines to move the data to an ECC device, then, at block 918, the memory controller 100 moves the data to the ECC device. The example method 900 concludes.

Figure 10:
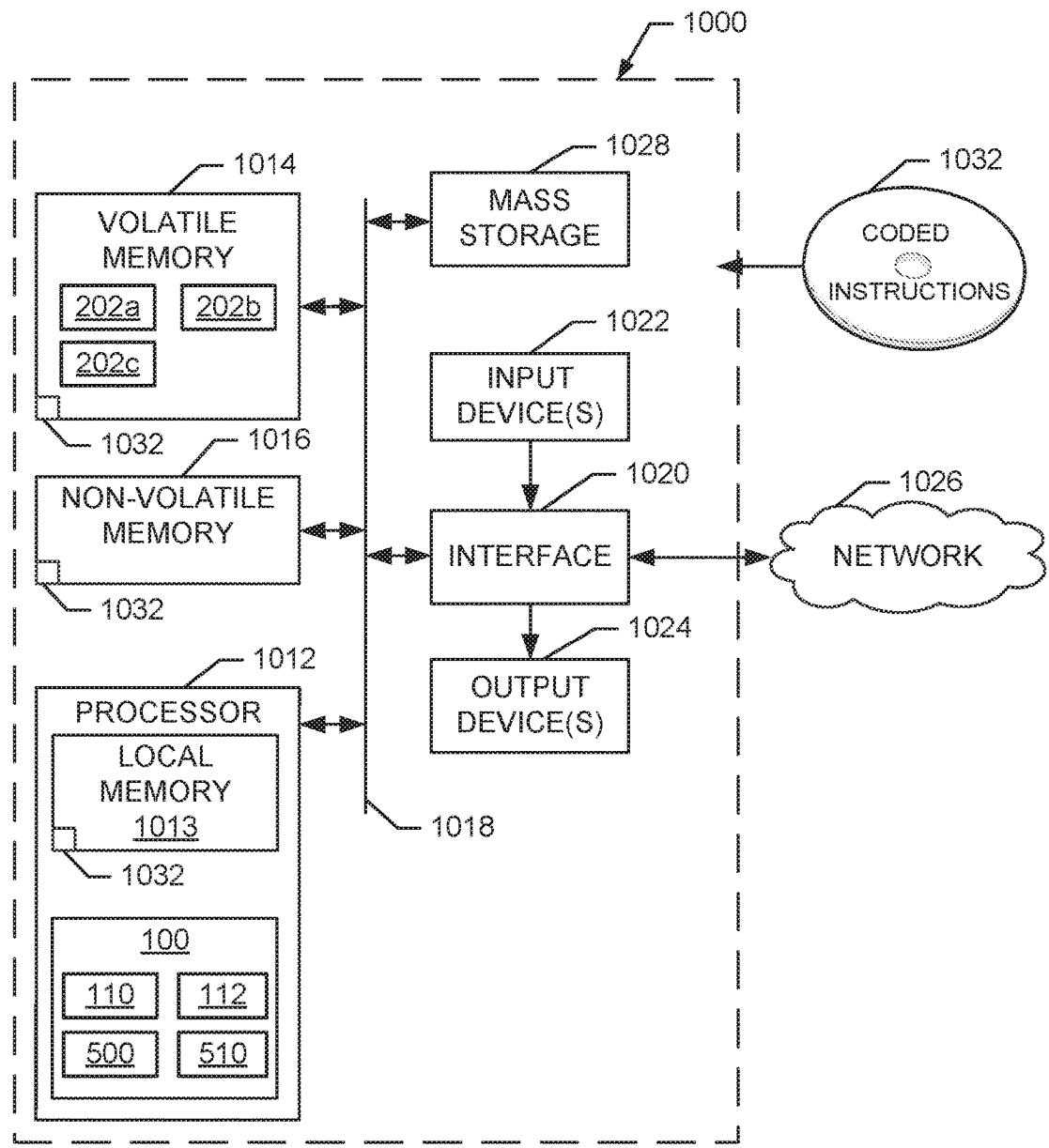
FIG. 10 is an example processor platform capable of executing the example computer readable instructions represented by FIG. 9 to implement the example memory controller of FIGS. 1-5 to perform memory error detection and/or correction of memory modules in accordance with the teachings of this disclosure.

FIG. 10 is a block diagram of an example processor platform 1000 capable of executing instructions to implement the process of FIG. 9 to implement the example memory controller 100 of FIGS. 1-5. Alternatively, a hardware implementation (e.g., an analog and/or logic circuit) of the example memory controller 100 may be implemented in the example processor platform 1000. The processor platform 1000 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors or controllers from any desired family or manufacturer. The hardware processor may be a semiconductor based (e.g., silicon based) device. In this example, the processor 1012 implements the example memory monitor 110, the example error corrector 112, the example memory interface 500, and the example error analyzer interface 510.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The volatile memory 1014 implements the memory modules 202 of FIG. 2, the memory module 0 202a of FIG. 3, the memory module 1 202b of FIG. 3, and/or the memory module 2 202c of FIGS. 3-4. The non-volatile memory 1016 may be implemented by flash memory and/or any other desired type of non-volatile memory device. Access to the main memory 1014, 1016 is controlled by a memory controller (e.g., the memory controller 100 of FIGS. 1-5).

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and/or commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1020 of the illustrated example, thus, typically includes a graphics driver card, a graphics driver chip and/or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives.

In some examples, coded instructions 1032 stored in the mass storage device 1028, in the local memory 1013, in the volatile memory 1014, in the non-volatile memory 1016, and/or on a removable tangible computer readable storage medium such as a CD or DVD may be provided to implement the example process of FIG. 9.

Figure 11:
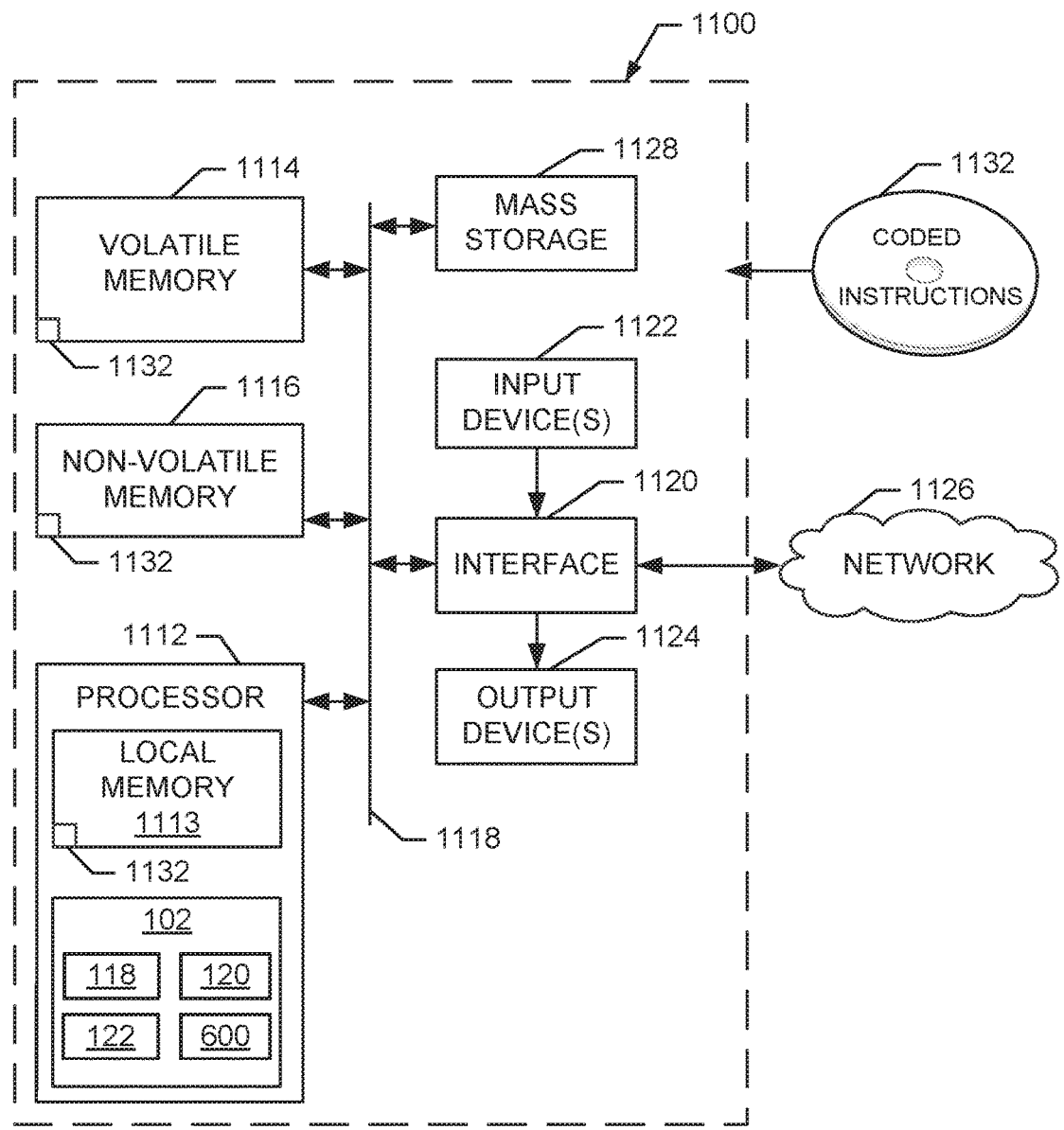
FIG. 11 is an example processor platform capable of executing the example computer readable instructions represented by FIGS. 7-8 to implement the example error analyzer of FIGS. 1-4 and 6 to perform memory error detection and/or correction of memory modules in accordance with the teachings of this disclosure.

FIG. 11 is a block diagram of an example processor platform 1100 capable of executing instructions to implement the processes of FIGS. 7-8 to implement the example error analyzer 102 of FIGS. 1-4 and 6. Alternatively, a hardware (e.g., an analog and/or logic circuit) implementation of the example error analyzer 102 may be implemented in the example processor platform 1100. The processor platform 1100 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1100 of the illustrated example includes a processor 1112. The processor 1112 of the illustrated example is hardware. For example, the processor 1112 can be implemented by one or more integrated circuits, logic circuits, microprocessors or controllers from any desired family or manufacturer. The hardware processor may be a semiconductor based (e.g., silicon based) device. In this example, the processor 1112 implements the example error manager 118, the example adaptive threshold manager 120, the example command generator 122, and the example memory controller interface 600.

The processor 1112 of the illustrated example includes a local memory 1113 (e.g., a cache). The processor 1112 of the illustrated example is in communication with a main memory including a volatile memory 1114 and a non-volatile memory 1116 via a bus 1118. The volatile memory 1114 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1116 may be implemented by flash memory and/or any other desired type of non-volatile memory device. Access to the main memory 1114, 1116 is controlled by a memory controller (e.g., the memory controller 100 of FIGS. 1-5).

The processor platform 1100 of the illustrated example also includes an interface circuit 1120. The interface circuit 1120 may be implemented by any type of interface standard, such as an Ethernet interface, a universal serial bus (USB), and/or a PCI express interface.

In the illustrated example, one or more input devices 1122 are connected to the interface circuit 1120. The input device(s) 1122 permit(s) a user to enter data and/or commands into the processor 1112. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1124 are also connected to the interface circuit 1120 of the illustrated example. The output devices 1124 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1120 of the illustrated example, thus, typically includes a graphics driver card, a graphics driver chip and/or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (e.g., an Ethernet connection, a digital subscriber line (DSL), a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, RAID systems, and digital versatile disk (DVD) drives.

In some examples, coded instructions 1132 stored in the mass storage device 1128, in the local memory 1113, in the volatile memory 1114, in the non-volatile memory 1116, and/or on a removable tangible computer readable storage medium such as a CD or DVD may be provided to implement the example process of FIGS. 7-8.

Figure 12:
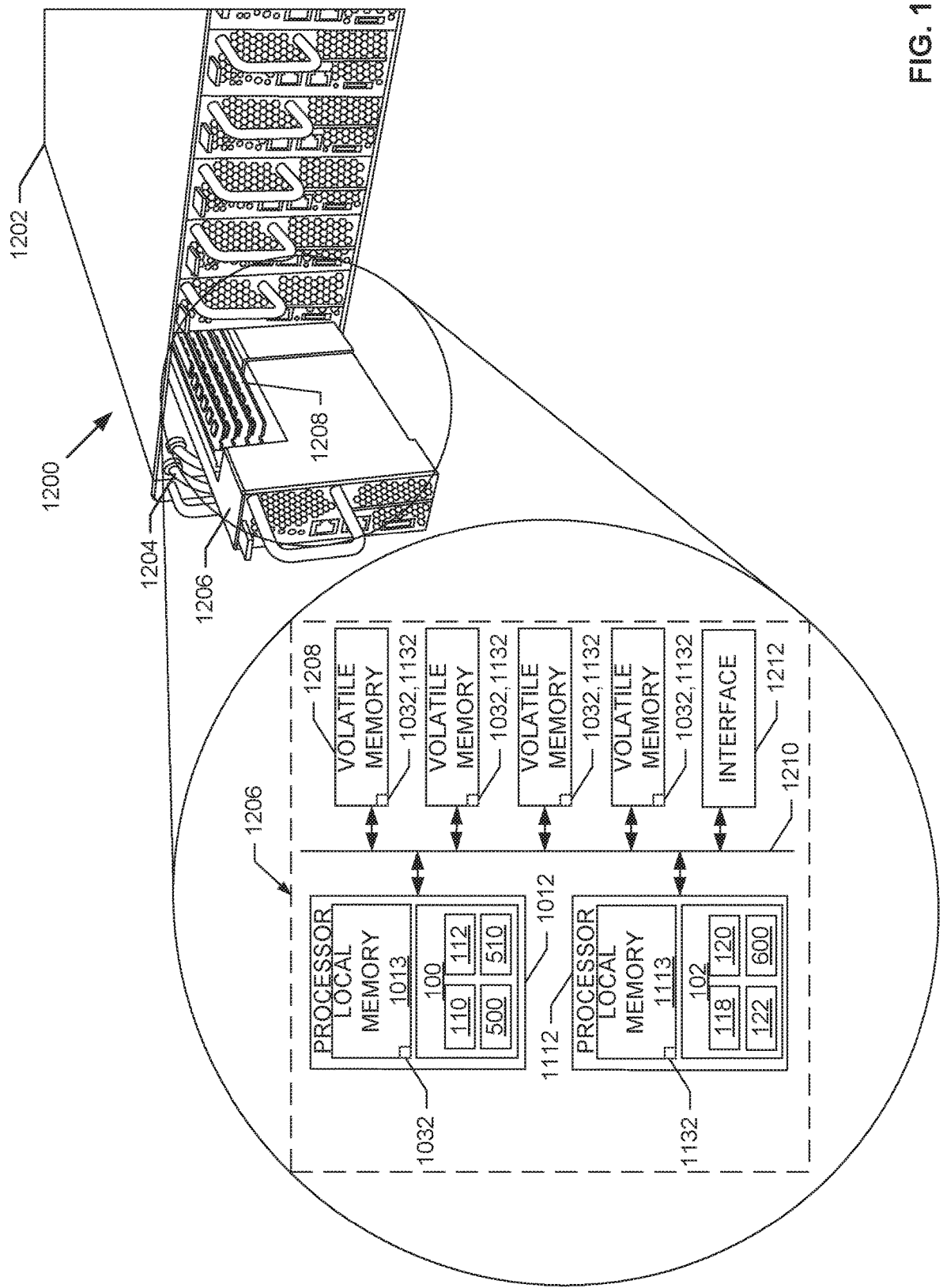
FIG. 12 is an example system capable of executing the example computer readable instructions represented in FIG. 9 to implement the example memory controller of FIGS. 1-5 and/or the example computer readable instructions represented in FIGS. 7-8 to implement the example error analyzer of FIGS. 1-4 and 6 to perform memory error detection and/or correction of memory modules in accordance with the teachings of this disclosure.

FIG. 12 is an example system 1200 capable of executing instructions to implement the example process of FIG. 9 to implement the example memory controller 100 of FIGS. 1-5 and/or the example processes of FIGS. 7-8 to implement the example error analyzer 102 of FIGS. 1-4 and 6. Alternatively, a hardware (e.g., an analog and/or logic circuit) implementation of the example memory controller 100 and/or the example error analyzer 102 may be employed in the example system 1200.

In the illustrated example, the system 1200 is a rackmount server. Alternatively, the system 1200 can be any other type of computing device or system. The system 1200 of the illustrated example includes a chassis 1202, which includes removably attached power supplies 1204 and removably attached servers 1206. In the illustrated example, the servers 1206 include the processor 1012 and the local memory 1013 of FIG. 10 and the processor 1112 and the local memory 1113 of FIG. 11.

The processors 1012, 1112 of the illustrated example are in communication with volatile memory 1208 via a bus 1210. In the illustrated example, the processor 1012 implements the example memory controller 100, the example memory monitor 110, the example error corrector 112, the example memory interface 500, and the example error analyzer interface 510. Also in the illustrated example, the processor 1112 implements the example error analyzer 102, the example error manager 118, the example adaptive threshold manager 120, the example command generator 122, and the example memory controller interface 600. The volatile memory 1208 may be implemented by Synchronous Dynamic Random Access Memory (SDRAM), Dynamic Random Access Memory (DRAM), RAMBUS Dynamic Random Access Memory (RDRAM) and/or any other type of random access memory device. In some examples, the volatile memory 1208 implements the volatile memory 1014, 1114 of FIGS. 10-11. Access to the volatile memory 1208 is controlled by a memory controller (e.g., the memory controller 100 of FIGS. 1-5).

The servers 1206 of the illustrated example also include an example interface circuit 1212. The example interface circuit 1212 may be implemented by any type of interface standard, such as an Ethernet interface, a universal serial bus (USB), and/or a PCI express interface. The example servers 1206 may be communicatively coupled to other computing devices or systems via the interface circuit 1212.

In some examples, the coded instructions 1032 stored in the local memory 1013 and/or in the volatile memory 1208 as shown in FIG. 12 may be provided to implement the example process of FIG. 9. In some examples, the coded instructions 1132 stored in the local memory 1113 and/or in the volatile memory 1208 as shown in FIG. 12 may be provided to implement the example processes of FIGS. 7-8. Additionally or alternatively, the servers 1206 may include additional components such as the non-volatile memory 1016, 1116 of FIGS. 11-12, the input devices 1022, 1122 of FIGS. 11-12, the output devices 1024, 1124 of FIGS. 11-12, the mass storage 1028, 1128 of FIGS. 11-12, etc.

Examples disclosed herein use adaptive-time window thresholds and/or error counters to improve error detection and/or correction accuracy and flexibility in memory devices relative to techniques used in prior memory devices. For example, hardware lifecycle and operating requirements can be translated into one or more corresponding adaptive-time window thresholds. Detected memory errors may be categorized using error counters corresponding to a memory location of the detected memory errors. A memory correction action may be triggered based on an error counter satisfying an adaptive-time window threshold. In this manner, examples disclosed herein may be used to improve data reliability of memory devices.

Examples disclosed herein are useful to improve performance in processing platforms and memory devices relative to techniques used in prior memory devices. Example improvements include reducing a frequency of hardware resources being diverted to correct memory errors and, therefore, greatly increasing system availability and performance. In addition, using examples disclosed herein prevents erroneous data movement to a spare region of an ECC device due to random errors. As a result, the spare region of the ECC device may be reserved for moving data from memory regions affected by persistent errors.

The following pertain to further examples disclosed herein.

Example 1 is an apparatus to monitor memory including an error manager to compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations, and update a first one of the counters corresponding to the first memory location when a first address of the first memory location matches a second address of one of the memory locations in the error history log. The apparatus further includes a command generator to transmit a command to an error corrector to perform error correction on the first memory location when the first one of the counters satisfies a threshold.

In Example 2, the subject matter of Example 1 can optionally include the error manager to generate a second counter corresponding to the first memory location when the first address of the first memory location does not match the second address of one of the memory locations in the error history log.

In Example 3, the subject matter of any one of Examples 1-2 can optionally include a memory controller interface to monitor a change in a voltage level of a status pin based on a memory monitor detecting the first memory location, the first memory location including a memory cell, and obtain the first address of the first memory location from the memory monitor when the voltage level of the status pin changes.

In Example 4, the subject matter of any one of Examples 1-3 can optionally include an adaptive threshold manager to generate the threshold, the threshold is a first adaptive-time window threshold, the first adaptive-time window threshold variable over time based on changes in at least one of a utilization, a temperature, or an elevation of the memory, and determine whether the first error is a random error or a persistent error based on the first one of the counters to satisfy the first adaptive-time window threshold.

In Example 5, the subject matter of any one of Examples 1-4 can optionally include that the first adaptive-time window threshold is based on a time difference between consecutive errors or a total number of errors within a time window.

In Example 6, the subject matter of any one of Examples 1-5 can optionally include that the adaptive threshold manager is to compare a second one of the counters to a second adaptive-time window threshold, the second adaptive-time window threshold different from the first adaptive-time window threshold.

In Example 7, the subject matter of any one of Examples 1-6 can optionally include that the error corrector is to perform the error correction by using an adaptive double device data correction process.

Example 8 is an apparatus to monitor memory including first means for comparing a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations. The apparatus of Example 8 further includes second means for updating a first one of the counters corresponding to the first memory location when a first address of the first memory location matches a second address of one of the memory locations in the error history log. The apparatus of Example 8 further includes third means for transmitting a command to a fourth means to perform error correction on the first memory location when the first one of the counters satisfies a threshold.

In Example 9, the subject matter of Example 8 can optionally include means for generating a second counter corresponding to the first memory location when the first address of the first memory location does not match the second address of one of the memory locations in the error history log.

In Example 10, the subject matter of any one of Examples 8-9 can optionally include means for monitoring a change in a voltage level of a status pin based on a memory monitor detecting the first memory location, the first memory location including a memory cell, and means for obtaining the first address of the first memory location from the memory monitor when the voltage level of the status pin changes.

In Example 11, the subject matter of any one of Examples 8-10 can optionally include that the fourth means is to perform the error correction by using an adaptive double device data correction process.

In Example 12, the subject matter of any one of Examples 8-11 can optionally include means for generating the threshold, the threshold is a first adaptive-time window threshold, the first adaptive-time window threshold variable over time based on changes in at least one of a utilization, a temperature, or an elevation of the memory, and means for determining whether the first error is a random error or a persistent error based on whether the first one of the counters satisfies the first adaptive-time window threshold.

In Example 13, the subject matter of any one of Examples 8-12 can optionally include that the first adaptive-time window threshold is based on a time difference between consecutive errors or a total number of errors within a time window.

In Example 14, the subject matter of any one of Examples 8-13 can optionally include means for comparing a second one of the counters to a second adaptive-time window threshold, the second adaptive-time window threshold different from the first adaptive-time window threshold.

Example 15 is a method to monitor memory including comparing a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations. The method of Example 1 further includes updating a first one of the counters corresponding to the first memory location when a first address of the first memory location matches a second address of one of the memory locations in the error history log, and transmitting a command to perform error correction on the first memory location when the first one of the counters satisfies a threshold.

In Example 16, the subject matter of Example 15 can optionally include generating a second counter corresponding to the first memory location when the first address of the first memory location does not match the second address of one of the memory locations in the error history log.

In Example 17, the subject matter of any one of Examples 15-16 can optionally include monitoring a change in a voltage level of a status pin, the change based on detecting the first memory location, the first memory location including a memory cell, and in response to the change in the voltage level of the status pin, obtaining the first address of the first memory location.

In Example 18, the subject matter of any one of Examples 15-17 can optionally include that performing the error correction includes using an adaptive double device data correction process.

In Example 19, the subject matter of any one of Examples 15-18 can optionally include generating the threshold, the threshold is a first adaptive-time window threshold, the first adaptive-time window threshold variable over time based on changes in at least one of a utilization, a temperature, or an elevation of the memory, and determining whether the first error is a random error or a persistent error based on whether the first one of the counters satisfies the first adaptive-time window threshold.

In Example 20, the subject matter of any one of Examples 15-19 can optionally include that the first adaptive-time window threshold is based on a time difference between consecutive errors or a total number of errors within a time window.

In Example 21, the subject matter of any one of Examples 15-20 can optionally include comparing a second one of the counters to a second adaptive-time window threshold, the second adaptive-time window threshold different from the first adaptive-time window threshold.

Example 22 is at least one article of manufacture including machine readable instructions that, when executed, cause a machine to at least compare a first memory location of a first error in memory to a plurality of memory locations in an error history log, the plurality of memory locations previously identified in the error history log based on errors detected in the memory locations, ones of the memory locations associated with corresponding counters that track the errors detected in the memory locations, update a first one of the counters corresponding to the first memory location when a first address of the first memory location matches a second address of one of the memory locations in the error history log, and transmit a command to perform error correction on the first memory location when the first one of the counters satisfies a threshold.

In Example 23, the subject matter of Example 22 can optionally include that the instructions are to cause the machine to at least generate a second counter corresponding to the first memory location when the first address of the first memory location does not match the second address of one of the memory locations in the error history log.

In Example 24, the subject matter of any one of Examples 22-23 can optionally include that the instructions are to cause the machine to at least monitor a change in a voltage level of a status pin, the change based on detecting the first memory location, the first memory location including a memory cell, and in response to the change in the voltage level of the status pin, obtain the first address of the first memory location.

In Example 25, the subject matter of any one of Examples 22-24 can optionally include that performing the error correction includes using an adaptive double device data correction process.

In Example 26, the subject matter of any one of Examples 22-25 can optionally include that the instructions are to cause the machine to at least generate the threshold, the threshold is a first adaptive-time window threshold, the first adaptive-time window threshold variable over time based on changes in at least one of a utilization, a temperature, or an elevation of the memory, and determine whether the first error is a random error or a persistent error based on whether the first one of the counters satisfies the first adaptive-time window threshold.

In Example 27, the subject matter of any one of Examples 22-26 can optionally include that the first adaptive time-window threshold is based on a time difference between consecutive errors or a total number of errors within a time window.

In Example 28, the subject matter of any one of Examples 22-27 can optionally include that the instructions are to cause the machine to at least compare a second one of the counters to a second adaptive-time window threshold, the second adaptive-time window threshold different from the first adaptive-time window threshold.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to monitor memory, the apparatus comprising:
    an error manager to:
        compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations; and
        update a first one of the counters corresponding to the first memory location in response to a first address of the first memory location matching a second address of one of the memory locations in the error history log;
    a memory controller interface to:
        monitor a change in a voltage level of a status pin based on a detection of the first memory location, the first memory location including a memory cell; and
        obtain the first address of the first memory location after the voltage level of the status pin changes; and
    a command generator to, in response to the first one of the counters satisfying a threshold, transmit a command to an error corrector to perform error correction on the first memory location.

2. The apparatus of claim 1, wherein the error manager is to generate a second counter corresponding to the first memory location in response to the first address of the first memory location not matching the second address of one of the memory locations in the error history log.

3. An apparatus to monitor memory, the apparatus comprising:
    an error manager to:
        compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations; and
        update a first one of the counters corresponding to the first memory location in response to a first address of the first memory location matching a second address of one of the memory locations in the error history log; and
    a command generator to, in response to the first one of the counters satisfying a threshold, transmit a command to an error corrector to perform error correction on the first memory location, the error corrector to perform the error correction by using an adaptive double device data correction process.

4. An apparatus to monitor memory, the apparatus comprising:
    an error manager to:
        compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations; and
        update a first one of the counters corresponding to the first memory location in response to a first address of the first memory location matching a second address of one of the memory locations in the error history log;
    a command generator to, in response to the first one of the counters satisfying a threshold, transmit a command to an error corrector to perform error correction on the first memory location; and
    an adaptive threshold manager to:
        generate the threshold, the threshold is a first adaptive-time window threshold, the first adaptive-time window threshold variable over time based on changes in at least one of a utilization, a temperature, or an elevation of the memory; and
        determine whether the first error is a random error or a persistent error based on whether the first one of the counters satisfies the first adaptive-time window threshold.

5. The apparatus of claim 4, wherein the first adaptive-time window threshold is based on a time difference between consecutive errors or a total number of errors within a time window.

6. The apparatus of claim 4, wherein the adaptive threshold manager is to compare a second one of the counters to a second adaptive-time window threshold, the second adaptive-time window threshold different from the first adaptive-time window threshold.

7. An apparatus to monitor memory, the apparatus comprising:
means for comparing to:
compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations; and
update a first one of the counters corresponding to the first memory location in response to a first address of the first memory location matching a second address of one of the memory locations in the error history log;
means for monitoring a change in a voltage level of a status pin based on a detection of the first memory location, the first memory location including a memory cell;
means for obtaining the first address of the first memory location after the voltage level of the status pin changes; and
means for transmitting a command to a means for performing error correction on the first memory location, the transmitting of the command in response to the first one of the counters satisfying a threshold.

8. The apparatus of claim 7, wherein the means for comparing is to generate a second counter corresponding to the first memory location in response to the first address of the first memory location not matching the second address of one of the memory locations in the error history log.

9. An apparatus to monitor memory, the apparatus comprising:
means for comparing to:
compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations; and
update a first one of the counters corresponding to the first memory location in response to a first address of the first memory location matching a second address of one of the memory locations in the error history log; and
means for transmitting a command to a means for performing error correction on the first memory location, the transmitting of the command in response to the first one of the counters satisfying a threshold, the means for performing error correction is to perform the error correction by using an adaptive double device data correction process.

10. An apparatus to monitor memory, the apparatus comprising:
means for comparing to:
compare a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations; and
update a first one of the counters corresponding to the first memory location in response to a first address of the first memory location matching a second address of one of the memory locations in the error history log;
means for transmitting a command to a means for performing error correction on the first memory location, the transmitting of the command in response to the first one of the counters satisfying a threshold; and
means for generating to:
generate the threshold, the threshold is a first adaptive-time window threshold, the first adaptive-time window threshold variable over time based on changes in at least one of a utilization, a temperature, or an elevation of the memory; and
determine whether the first error is a random error or a persistent error based on whether the first one of the counters satisfies the first adaptive-time window threshold.

11. The apparatus of claim 10, wherein the first adaptive-time window threshold is based on a time difference between consecutive errors or a total number of errors within a time window.

12. The apparatus of claim 10, wherein the means for comparing is to compare a second one of the counters to a second adaptive-time window threshold, the second adaptive-time window threshold different from the first adaptive-time window threshold.

13. A method to monitor memory, the method comprising:
comparing, with a processor, a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations;
updating, with the processor, a first one of the counters corresponding to the first memory location in response to a first address of the first memory location matching a second address of one of the memory locations in the error history log;
monitoring, with the processor, a change in a voltage level of a status pin, the change based on detecting the first memory location, the first memory location including a memory cell;
in response to the change in the voltage level of the status pin, obtaining, with the processor, the first address of the first memory location; and
transmitting, with the processor, a command to perform error correction on the first memory location, the transmitting in response to the first one of the counters satisfying a threshold.

14. The method of claim 13, further including generating a second counter corresponding to the first memory location in response to the first address of the first memory location not matching the second address of one of the memory locations in the error history log.

15. A method to monitor memory, the method comprising:
comparing, by executing an instruction with a processor, a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations;

updating, by executing an instruction with the processor, a first one of the counters corresponding to the first memory location in response to a first address of the first memory location matching a second address of one of the memory locations in the error history log;

transmitting, by executing an instruction with the processor, a command to perform error correction on the first memory location, the transmitting in response to the first one of the counters satisfying a threshold;

generating the threshold, the threshold is a first adaptive-time window threshold, the first adaptive-time window threshold variable over time based on changes in at least one of a utilization, a temperature, or an elevation of the memory; and determining whether the first error is a random error or a persistent error based on whether the first one of the counters satisfies the first adaptive-time window threshold.

16. The method of claim 15, wherein the first adaptive-time window threshold is based on a time difference between consecutive errors or a total number of errors within a time window.

17. The method of claim 15, further including comparing a second one of the counters to a second adaptive-time window threshold, the second adaptive-time window threshold different from the first adaptive-time window threshold.

18. A non-transitory computer readable storage medium comprising instructions that, when executed, cause a machine to at least:

compare a first memory location of a first error in memory to a plurality of memory locations in an error history log, the plurality of memory locations previously identified in the error history log based on errors detected in the memory locations, ones of the memory locations associated with corresponding counters that track the errors detected in the memory locations;

update a first one of the counters corresponding to the first memory location in response to a first address of the first memory location matching a second address of one of the memory locations in the error history log;

monitor a change in a voltage level of a status pin, the change based on a detection of the first memory location, the first memory location including a memory cell;

in response to the change in the voltage level of the status pin, obtain the first address of the first memory location; and transmit, in response to the first one of the counters satisfying a threshold, a command to perform error correction on the first memory location.

19. The non-transitory computer readable storage medium of claim 18, wherein the instructions, when executed, cause the machine to generate a second counter corresponding to the first memory location in response the first address of the first memory location not matching the second address of one of the memory locations in the error history log.

20. A non-transitory computer readable storage medium comprising instructions that, when executed, cause a machine to at least:

compare a first memory location of a first error in memory to a plurality of memory locations in an error history log, the plurality of memory locations previously identified in the error history log based on errors detected in the memory locations, ones of the memory locations associated with corresponding counters that track the errors detected in the memory locations;

update a first one of the counters corresponding to the first memory location in response to a first address of the first memory location matching a second address of one of the memory locations in the error history log; and transmit, in response to the first one of the counters satisfying a threshold, a command to perform error correction on the first memory location, the error correction to be performed by using an adaptive double device data correction process.

21. The non-transitory computer readable storage medium of claim 20, wherein the instructions, when executed, cause the machine to generate a second counter corresponding to the first memory location when the first address of the first memory location does not match the second address of one of the memory locations in the error history log.

22. A non-transitory computer readable storage medium comprising instructions that, when executed, cause a machine to at least:

compare a first memory location of a first error in memory to a plurality of memory locations in an error history log, the plurality of memory locations previously identified in the error history log based on errors detected in the memory locations, ones of the memory locations associated with corresponding counters that track the errors detected in the memory locations;

update a first one of the counters corresponding to the first memory location in response to a first address of the first memory location matching a second address of one of the memory locations in the error history log;

transmit, in response to the first one of the counters satisfying a threshold, a command to perform error correction on the first memory location;

generate the threshold, the threshold is a first adaptive-time window threshold, the first adaptive-time window threshold variable over time based on changes in at least one of a utilization, a temperature, or an elevation of the memory; and determine whether the first error is a random error or a persistent error based on whether the first one of the counters satisfies the first adaptive-time window threshold.

23. The non-transitory computer readable storage medium of claim 22, wherein the instructions, when executed, cause the machine to generate the first adaptive-time window threshold based on a time difference between consecutive errors or a total number of errors within a time window.

24. The non-transitory computer readable storage medium of claim 22, wherein the instructions, when executed, cause the machine to compare a second one of the counters to a second adaptive-time window threshold, the second adaptive-time window threshold different from the first adaptive-time window threshold.

25. A method to monitor memory, the method comprising:

comparing a first memory location of a first error in the memory to a plurality of memory locations in an error history log, the plurality of memory locations previously identified in the error history log based on errors detected in the memory locations, ones of the memory locations associated with corresponding counters that track the errors detected in the memory locations;

updating a first one of the counters corresponding to the first memory location in response to a first address of the first memory location matching a second address of one of the memory locations in the error history log; and transmitting a command to perform error correction on the first memory location, the transmitting in response to the first one of the counters satisfying a threshold, the error correction to be performed using an adaptive double device data correction process.

\* \* \* \* \*